US008136076B2

(12) United States Patent
Bachina et al.

(10) Patent No.: US 8,136,076 B2
(45) Date of Patent: Mar. 13, 2012

(54) METHOD AND SYSTEM FOR MOUNTING CIRCUIT DESIGN ON RECONFIGURABLE DEVICE

(75) Inventors: Satish Bachina, Karnataka (IN);
Prakash S. Murthy, Tokyo (JP);
Vanamamalai Kannan, Karnataka (IN);
Vinay C. Hegde, Karnataka (IN);
Hiroyuki Kimura, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 300 days.

(21) Appl. No.: 12/439,132

(22) PCT Filed: Aug. 31, 2007

(86) PCT No.: PCT/JP2007/067037
§ 371 (c)(1),
(2), (4) Date: Sep. 23, 2009

(87) PCT Pub. No.: WO2008/026731
PCT Pub. Date: Mar. 6, 2008

(65) Prior Publication Data
US 2010/0017774 A1 Jan. 21, 2010

(30) Foreign Application Priority Data
Aug. 31, 2006 (JP) .................................. 2006-235063

(51) Int. Cl.
*G06F 17/50* (2006.01)
(52) U.S. Cl. ........ 716/126; 716/113; 716/132; 716/119; 716/116; 716/108; 716/104; 716/101
(58) Field of Classification Search .................. 716/101, 716/104, 108, 113, 116, 132, 119, 126
See application file for complete search history.

(56) References Cited

U.S. PATENT DOCUMENTS

| 6,099,583 | A | 8/2000 | Nag |
| 6,813,754 | B2 | 11/2004 | Wu et al. |
| 7,428,721 | B2 * | 9/2008 | Rohe et al. ................... 716/138 |
| 2002/0101258 | A1 * | 8/2002 | Ting .............................. 326/41 |
| 2002/0163357 | A1 * | 11/2002 | Ting .............................. 326/41 |
| 2007/0101242 | A1 * | 5/2007 | Yancey et al. ................ 714/776 |
| 2009/0031106 | A1 * | 1/2009 | Honda ............................. 712/29 |

FOREIGN PATENT DOCUMENTS

| JP | 2000-200298 | 7/2000 |
| WO | WO-02/095946 | 11/2002 |

OTHER PUBLICATIONS

International Preliminary Report on Patentability for PCT/JP2007/067037 dated Mar. 17, 2009.

(Continued)

*Primary Examiner* — Nghia Doan
*Assistant Examiner* — Brian Ngo

(57) ABSTRACT

There is provided a system for generating configuration data for implementing a circuit design in a segmented reconfigurable device. A placement and routing design aiding system (30) includes a database (31) for storing hardware information (89) including data of PEs included in each segment and data of a first-level and second-level routing matrix and an apparatus (33) for mapping the circuit design onto the PEs. The mapping apparatus (33) generates mappings of the circuit design onto the PEs by carrying out an iterative algorithm that minimizes a cost function based on the hardware information (89). The cost function includes an item that minimizes usage of the second-level routing matrix (22) that connects between the segments.

13 Claims, 18 Drawing Sheets

OTHER PUBLICATIONS

Hu et al. "Minimizing the number of delay buffers in the synchronization of pipelined systems", IEEE Transactions on Computer-Aided Design of Integrated Circuits and Systems, 13:1441-1449 (1994).

International Search Report for corresponding International Application No. PCT/JP2007/067037, dated Oct. 9, 2007.

Kobata et al., "Clustering technique to reduce chip area and delay for FPGA", The Transactions of the Institute of Electronics, Information and Communication Engineers, Shadan Hojin the Institute of Electronics, Information and Communication Engineers, J89-D: 1153-62 (2006).

* cited by examiner

Fig. 12

|    |    |    |    |
|----|----|----|----|
| A3 | A1 | A1 | A1 |
| B  | B  | B  | B  |
| A3 | A2 | A2 | A2 |
| A3 | A3 | A3 | A2 |

| Type of PE | Executable instructions | Number | Priority rankings |
|---|---|---|---|
| A1 | aa, cc, dd, ee | 3 | ① |
| A2 | aa, bb, dd, ee | 4 | ② |
| A3 | aa, dd, ee | 5 | ③ |
| (A1~A3) | (aa, dd, ee) | 12 | ④ |
| B |  | 4 | ② |

| (A3) | (A1) | PE6 (A1) | PE5 (A1) |
|---|---|---|---|
| (B) | G1 (B) | (B) | (B) |
| (A3) | (A2) | PE4 (A2) | PE1 (A2) |
| PE7 (A3) | (A3) | (A3) | (A3) |

→ Y, ↓ X

CFα = 32

(b)

|  | PE5 | PE6 |  |
|---|---|---|---|
|  |  |  | G1 |
|  |  | PE1 |  |
| PE7 |  |  | PE4 |

CFα = 26

(c)

|  | PE6 |  | PE5 |
|---|---|---|---|
|  |  | G1 |  |
|  | PE4 |  |  |
| PE7 |  | PE1 |  |

CFα = 32

(d)

|  |  | PE1 | PE5 |
|---|---|---|---|
|  |  |  | G1 |
|  |  | PE6 |  |
| PE7 |  |  | PE4 |

CFα = 22

(e)

| PE1 |  | PE5 |  |
|---|---|---|---|
|  |  | G1 |  |
|  |  |  |  |
| PE7 | PE8 |  | PE4 |

|   | 0 | 1 | 2 | 3 | 4 | 5 | 6 | 7 |   |
|---|---|---|---|---|---|---|---|---|---|
| 0 | LDB | | LDB | | LDB | | LDB | | |
| 1 | RAM | C16L | C16L | C16L | C16L | C16E | C16E | DLH | |
| 2 | RAM | EXC | EXC | EXC | EXC | EXC | EXF | DLH | |
| 3 | RAM | EXS | EXS | EXS | EXS | EXS | EXF | DLH | Segment 0 |
| 4 | RAM | EXR | EXR | EXR | EXR | EXR | EXF | DLH | |
| 5 | RAM | DLE | DLE | DLE | DLE | DLE | DLE | DLH | |
| 6 | EXM | EXM | EXM | EXM | EXM | EXM | EXM | DLH | |
| 7 | DLV | DLV | DLV | DLV | DLV | DLV | DLV | DLX | |

|   | 0 | 1 | 2 | 3 | 4 | 5 | 6 | 7 |   |
|---|---|---|---|---|---|---|---|---|---|
| 0 | EXC | EXC | EXF | EXF | LDX | LDX | LDX | LDX | |
| 1 | DLH | C32L | C32L | C32L | C32L | C32E | C32E | RAM | |
| 2 | DLH | EXF | EXC | EXC | EXC | EXC | EXC | RAM | |
| 3 | DLH | EXF | EXS | EXS | EXS | EXS | EXS | RAM | Segment 3 |
| 4 | DLH | EXF | EXR | EXR | EXR | EXR | EXR | RAM | |
| 5 | DLH | DLE | DLE | DLE | DLE | DLE | DLE | RAM | |
| 6 | DLH | EXM | EXM | EXM | EXM | EXM | EXM | RAM | |
| 7 | DLX | DLV | DLV | DLV | DLV | DLV | DLV | DLV | |

|   | 0 | 1 | 2 | 3 | 4 | 5 | 6 | 7 |   |
|---|---|---|---|---|---|---|---|---|---|
| 0 | DLV | DLV | DLV | DLV | DLV | DLV | DLV | DLX | |
| 1 | RAM | EXM | EXM | EXM | EXM | EXM | EXM | DLH | |
| 2 | RAM | EXF | EXF | EXF | EXF | EXS | EXM | DLH | |
| 3 | RAM | DLE | DLE | DLE | DLE | DLE | DLE | DLH | Segment 1 |
| 4 | RAM | EXC | EXC | EXC | EXC | EXS | EXS | DLH | |
| 5 | RAM | EXR | EXR | EXR | EXR | EXS | EXM | DLH | |
| 6 | RAM | EXM | EXM | EXM | EXM | EXM | EXM | DLH | |
| 7 | DLV | DLV | DLV | DLV | DLV | DLV | DLV | DLX | |

|   | 0 | 1 | 2 | 3 | 4 | 5 | 6 | 7 |   |
|---|---|---|---|---|---|---|---|---|---|
| 0 | DLX | DLV | DLV | DLV | DLV | DLV | DLV | DLX | |
| 1 | DLH | EXM | EXM | EXM | EXM | EXM | EXM | RAM | |
| 2 | DLH | EXM | EXS | EXF | EXF | EXF | EXF | RAM | |
| 3 | DLH | DLE | DLE | DLE | DLE | DLE | DLE | RAM | Segment 4 |
| 4 | DLH | EXS | EXS | EXC | EXC | EXC | EXC | RAM | |
| 5 | DLH | EXM | EXS | EXR | EXR | EXR | EXR | RAM | |
| 6 | DLH | EXM | EXM | EXM | EXM | EXM | EXM | RAM | |
| 7 | DLH | DLV | DLV | DLV | DLV | DLV | DLV | DLV | |

|   | 0 | 1 | 2 | 3 | 4 | 5 | 6 | 7 |   |
|---|---|---|---|---|---|---|---|---|---|
| 0 | DLV | DLV | DLV | DLV | DLV | DLV | DLV | DLX | |
| 1 | EXM | EXM | EXM | EXM | EXM | EXM | EXM | DLH | |
| 2 | RAM | DLE | DLE | DLE | DLE | DLE | DLE | DLH | |
| 3 | RAM | EXR | EXR | EXR | EXR | EXR | EXF | DLH | Segment 2 |
| 4 | RAM | EXS | EXS | EXS | EXS | EXS | EXF | DLH | |
| 5 | RAM | EXC | EXC | EXC | EXC | EXC | EXF | DLH | |
| 6 | RAM | C16S | C16S | C16S | C16S | C16E | C16E | DLH | |
| 7 | STB | | STB | | STB | | STB | | |

|   | 0 | 1 | 2 | 3 | 4 | 5 | 6 | 7 |   |
|---|---|---|---|---|---|---|---|---|---|
| 0 | DLX | DLV | DLV | DLV | DLV | DLV | DLV | DLV | |
| 1 | DLH | EXM | EXM | EXM | EXM | EXM | EXM | RAM | |
| 2 | DLH | DLE | DLE | DLE | DLE | DLE | DLE | RAM | |
| 3 | DLH | EXF | EXR | EXR | EXR | EXR | EXR | RAM | Segment 5 |
| 4 | DLH | EXF | EXS | EXS | EXS | EXS | EXS | RAM | |
| 5 | DLH | EXF | EXC | EXC | EXC | EXC | EXC | RAM | |
| 6 | DLH | C32S | C32S | C32S | C32S | C32E | C32E | RAM | |
| 7 | EXC | EXC | EXF | EXF | STX | STX | STX | STX | |

$$\begin{aligned} \text{Cost} &= \text{Intra-segment cost} + \text{Inter-segment cost} \\ &= \quad\quad 4 \times 5 \quad\quad + \quad\quad 6 \times 3 \\ &= 38 \end{aligned}$$

METHOD AND SYSTEM FOR MOUNTING CIRCUIT DESIGN ON RECONFIGURABLE DEVICE

FIELD OF THE INVENTION

The present invention relates to a method and system for implementing a desired circuit design in a device in which circuits can be reconfigured.

RELATED ART

Japanese Laid-Open Patent Publication No. 2000-200298 discloses an automatic placement method that is characterized by storing circuit data, which is composed of a component list and a net list, and placement data for the circuit data in a database, converting new circuit data and circuit data in the database respectively to graphs composed of nodes and edges, matching the converted graphs with one another to find circuit data with a high degree of matching, and placing the new circuit data in accordance with placement data that is paired with the circuit data found by the matching. The publication states that simulated annealing, a neural network, mean field annealing, or a genetic algorithm is used when placing the new circuit in accordance with the placement data paired with the circuit data that has been found. When placing the new circuit data in accordance with placement data paired with the circuit data that has been found, the components of the circuit data and the components of the new circuit data are associated, a cost function that evaluates a placement for the new circuit data is generated using at least the associations and the placement data, and the cost function is minimized. When minimizing the cost function, at least one initial placement is generated and the placement is then updated by moving or rotating a component or a component group.

U.S. Pat. No. 6,099,583 discloses a method for programming a programmable logic device (PLD) to implement a logic operation. The PLD includes a plurality of configurable logic blocks (CLBs). The logic operation is defined by a plurality of cores, each core including a plurality of interrelated logic portions. The method comprises providing a configuration data table including a plurality of CLB sites, each CLB site including memory locations corresponding to an associated one of the plurality of CLBs; placing only a reserved logic portion of each of the plurality of cores into the configuration data table to form a first placement arrangement in the configuration data table, wherein one or more non-reserved logic portions of each of the plurality of cores are omitted from the first placement arrangement, and wherein a first reserved logic portion of a first core is assigned to a first CLB site; annealing the first placement arrangement by moving the first reserved logic portion of the first core from the first CLB site to a second CLB site, thereby forming a second placement arrangement in the configuration data table; and placing the one or more non-reserved logic portion of each of the plurality of cores into the configuration data table, wherein a first non-reserved logic portion of the first core is assigned to a third CLB site.

U.S. Pat. No. 6,813,754 discloses a method of mapping a plurality of circuit elements onto a plurality of CLB of a PLD using a computer. In this publication, the plurality of circuit elements in a circuit design are packed into blocks that correspond to single CLBs and the blocks are assigned to the CLBs of the PLD to generate a mapping. When doing so, simulated annealing is used. In addition, the method of mapping comprises selecting a critical path in the PLD corresponding to the mapping. The critical path comprises a first node in a first GLB in the PLD. The first CLB further comprises one or more other nodes. The method of mapping also comprises changing node assignment of the first node from a current location to a different location without changing node assignment of at least one other node in the first CLB and such change in node assignment results in a change of circuit performance. The different location falls within an area adjacent to the current location, the first node is a terminal node and the area is a circle centered at a connecting node having a radius corresponding to a distance measure between the terminal and connecting nodes.

In a reconfigurable device that includes a PLD such as an FPGA (Field Programmable Gate Array), when deciding the placement of a circuit composed of a plurality of components, an extremely long time is required to investigate all of the connections that can be implemented in the device. An automatic placement method that uses an iterative algorithm including simulated annealing which uses the principles of state transitions due to disturbances caused to molecules by heat can produce a solution that is the optimum placement or is close to the optimum placement in a short time using random factors. When investigating the placement and routing of a device, it is also important to improve the performance of the circuit implemented in the device. For example, it is important to improve the timing closure and/or the critical paths. If it becomes necessary to greatly change a placement selected by an automatic placement method to improve the circuit performance, most of the benefit of automatic placing will be lost. On the other hand, if critical paths are selected for each out of a plurality of provisional placements that have been selected using random factors and improvements are then investigated for each, the time required for automatic placement will increase.

SUMMARY OF THE INVENTION

One aspect of the present invention is a method for generating configuration data for implementing a circuit design in a reconfigurable device. The device includes a plurality of processing elements and a routing matrix for connecting the plurality of processing elements and is reconfigured by changing functions of the respective processing elements in the plurality of processing elements and/or changing at least some connections of the routing matrix. In the device, the plurality of processing elements are divided into a plurality of groups, processing elements included within each group are connected in a range of a first delay by a first-level routing matrix included in the routing matrix, and processing elements included in different groups are connected with a different delay to the first delay via a second-level routing matrix included in the routing matrix.

The method of generating configuration data includes steps of: preparing hardware information on a database that enables a computer to access, the hardware information including definition data for the plurality of processing elements included in the respective groups and definition data for the routing matrix; and mapping a circuit design onto the plurality of processing elements for implementing the circuit design in the device by the configuration data, by having the computer carry out an iterative algorithm that minimizes a cost function. The cost function includes an item (a term) that minimizes usage of the second-level routing matrix. The delay of a signal between processing elements that are connected using the second-level routing matrix is longer than the delay (the first delay) of a signal between processing elements connected by only the first-level routing matrix. In this method, an assignment (placement) having little usage of the second-level routing matrix is selected. Accordingly, by carrying out an iterative algorithm, an assignment where the delays between processing elements are reduced is selected when mapping the circuit design onto the device, which makes it possible to improve the circuit performance. The expression "iterative algorithm" includes simulated annealing, mean field annealing, and a genetic algorithm.

The circuit design should preferably include a data flow graph (data flowgram) in which functions to be implemented in the device is expressed as a plurality of functional blocks and connections between the plurality of functional blocks. The functional blocks are capable of being implemented in processing elements out of the plurality of processing elements. The step of mapping should preferably include: provisionally assigning the plurality of functional blocks to processing elements out of the plurality of processing elements divided into the plurality of groups; and changing assignments of the plurality of functional blocks to the plurality of processing elements using the iterative algorithm. The step of changing the assignments includes finding a value of the cost function based on a route that connects a plurality of assigned processing elements that have been respectively assigned the plurality of functional blocks.

The step of mapping should preferably include: analyzing the data flow graph and storing timing of inputs and/or outputs of data to and from the plurality of functional blocks in a memory; and after the changing the assignments, analyzing connections between the plurality of assigned processing elements including delays due to passing the second-level routing matrix, and assigning delays for realizing the timing stored in the memory to processing elements out of the plurality of processing elements.

By selecting an assignment (mapping, placement) that minimizes a cost function during a process that changes the assignments of a plurality of functional blocks onto a plurality of processing elements using an iterative algorithm including simulated annealing, a high performance mapping should be selected and there may not necessary to calculate critical paths or to verify timing. Since the plurality of processing elements included in a group are connected within a range of a first delay, for example, one cycle, by the first-level routing matrix, the timing is secured and it may not necessary to improve the critical paths. Connections between a plurality of processing elements included in different groups are minimized by minimizing the cost function. This means that by verifying the timing including the second-level routing matrix after the process that changes the assignments, it is possible to reduce the time taken to generating a mapping.

The plurality of functional blocks that configure the data flow graph may include a plurality of types of functional block. The device may include processing elements that can be configured so as to correspond to all of the types of functional block. In another example, the device may include a plurality of types of processing element that can be configured so as to respectively correspond to restricted types of functional block out of the plurality of types of functional block. When mapping onto such device, the step of provisionally assigning should preferably further include assigning the plurality of functional blocks with priority given to a type of processing element with a low number of elements included in the plurality of processing elements out of the plurality of types of processing element, and when doing so, assigning a plurality of functional blocks that can be assigned to a plurality of processing elements of a given type (the first type) randomly to processing elements out of the plurality of processing elements of such type. Here, random assigning includes generating random numbers, and assigning a plurality of functional blocks that can be assigned to the plurality of processing elements of the first type in accordance with the random numbers to processing elements out of the plurality of processing elements of the first type. In the step of provisionally assigning for the initial mapping, by prioritizing assigning to a non-numerous (a little quantity) type of processing element, it is possible to improve the usage efficiency of the processing elements in the device. This means that it becomes possible to generate information for mapping a circuit design that requires a large number of processing elements onto a reconfigurable device. Also, information for simultaneously mapping a plurality of circuit designs onto a reconfigurable device may be generated.

The step of provisionally assigning should preferably further include randomly assigning first specified functional blocks included in the plurality of functional blocks to processing elements out of the plurality of processing elements in a specified group out of a plurality of groups with priority over the step of random assignment to processing elements out of the plurality of processing elements of the given type. The step of changing the assignments should also preferably include changing assignments the first specified functional blocks to processing elements out of the plurality of processing elements of the specified group.

The step of provisionally assigning should preferably further include assigning second specified functional blocks included in the plurality of functional blocks to specified processing elements out of the plurality of processing elements with priority over the step of random assignment to processing elements out of the plurality of processing elements of the specified group. The step of changing the assignments should preferably also include fixing and not changing assignments of the second specified functional blocks.

A different aspect of the present invention is a method that includes mapping a circuit design onto a reconfigurable device. The circuit design includes a data flow graph in which functions to be implemented in the device are expressed as a plurality of functional blocks that are capable of being implemented in processing elements out of the plurality of processing elements and connections between the plurality of functional blocks. The step of mapping includes steps of: provisionally assigning the plurality of functional blocks to processing elements out of the plurality of processing elements divided into the plurality of groups; and changing assignments of the functional blocks to the plurality of processing elements using an iterative algorithm that minimizes a cost function. The cost function includes an item (a term) that minimizes usage of the second-level routing matrix. The step of changing the assignments also includes finding a value of the cost function from connections between a plurality of assigned processing elements to which the plurality of functional blocks have been assigned.

Yet another aspect of the present invention is a system that is generative configuration data for reconfiguring a reconfigurable device. The system includes a database for storing hardware information that includes definition data for a plurality of processing elements included in respective groups and definition data for a routing matrix. The system also includes an apparatus that is generative (for generating) a mapping of a circuit design onto the plurality of processing elements for implementing the circuit design on the device by the configuration data. The mapping apparatus generates mapping of the circuit design onto the plurality of processing elements by carrying out an iterative algorithm that minimizes a cost function based on the hardware information. The cost function includes an item (term) that minimizes usage of the second-level routing matrix.

In addition, corresponding to the data flow graph (data flowgram) described above, the mapping apparatus should preferably include: a functional unit that provisionally assigns the plurality of functional blocks to processing elements out of the plurality of processing elements divided into the plurality of groups; and a functional unit that changes assignments of the plurality of functional blocks to the plurality of processing elements using an iterative algorithm. The functional unit that changes the assignments includes finding a value of the cost function from connections between a plurality of assigned processing elements that have been respectively assigned the plurality of functional blocks.

Also, the mapping apparatus should preferably include: a functional unit that analyzes the data flow graph and stores timing of inputs and/or outputs of data to and from the plurality of functional blocks in a memory; and a functional unit that analyzes connections between the plurality of assigned processing elements including delays due to passing the second-level routing matrix, and assigns delays for realizing the timing stored in the memory to processing elements out of the plurality of processing elements.

Yet another aspect of the present invention is an apparatus that is generative a mapping of a circuit design onto a plurality of processing elements of a reconfigurable device for implementing the circuit design in the device by configuration data.

Yet another aspect of the present invention is a program or a program product for causing a computer to generate configuration data for reconfiguring a reconfigurable device. The program product includes preparing hardware information including definition data for the plurality of processing elements included in the respective groups and definition data for the routing matrix on a database that the computer can access to. The program also includes mapping a circuit design onto the plurality of processing elements for implementing the circuit design on the device by the configuration data, by having the computer carry out an iterative algorithm that minimizes a cost function. The cost function includes an item that minimizes usage of the second-level routing matrix. The program or program product can be provided by being recorded on a suitable medium that can be read by a computer. Such program or program product can also be provided via a computer network such as the Internet.

BRIEF DESCRIPTION OF THE DRAWINGS

FIG. 12 shows a simplified example of hardware (a device) for explaining mapping.

FIG. 13 shows an example of hardware information.

FIGS. 17(a) to 17(e) show a number of examples where the DFG shown in FIG. 14 has been mapped onto the device shown in FIG. 12 in accordance with the priority bucket shown in FIG. 16.

FIG. 23 shows yet another example of mapping obtained by the SA process.

EXAMPLE OF THE INVENTION

Figure 1:
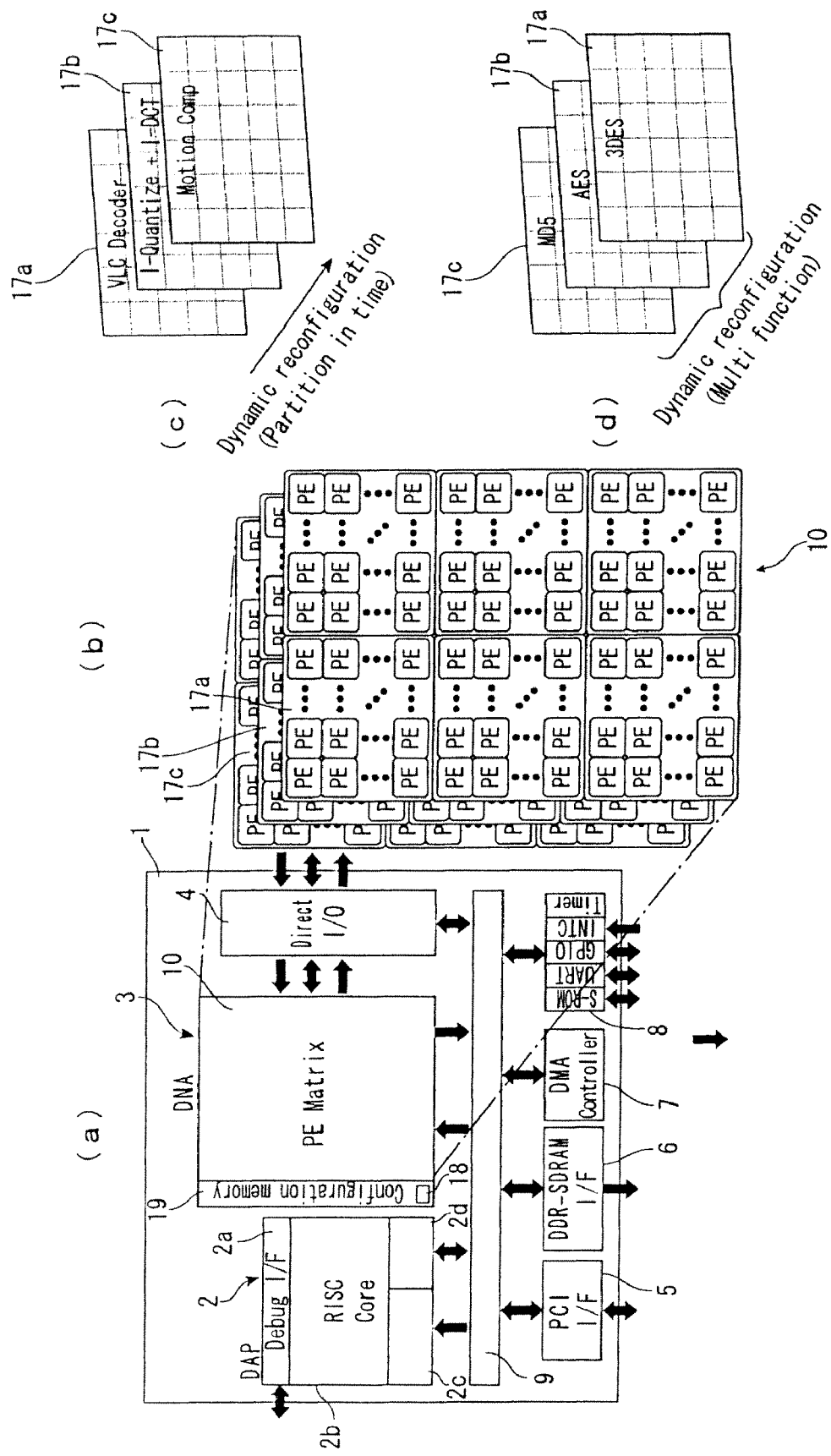
FIG. 1(a) shows the overall arrangement of one example of a reconfigurable device, FIG. 1(b) schematically shows a PE matrix.
FIG. 1(c) and FIG. 1(d) show how the PE matrix is dynamically reconfigured.

FIG. 1(a) shows one example of a reconfigurable device. This device 1 is a semiconductor integrated circuit device called a "DAPDNA" that has been developed by the present applicant. The device 1 includes a RISC core module 2 called a "DAP" and a dynamic reconfigurable data-flow accelerator 3 called a "DNA". In addition to the DAP 2 and the DNA 3, the device 1 includes an interface 4 for direct input/output to the DNA 3, a PCI interface 5, an SDRAM interface 6, a DMA controller 7, other peripheral devices 8, and a high-speed switching bus 9 for connecting such elements. The DAP 2 includes a debugging interface 2a, a RISC core 2b, an instruction cache 2c, and a data cache 2d. The DNA 3 includes a PE matrix 10 where 376 processing elements PE (hereinafter simply referred to as "PE" or "PEs") are placed in two dimensions and a configuration memory 19 that stores configuration data 18 for reconfiguring the PE matrix 10 by changing the functions of the plurality of processing elements PE (PEs) included in the PE matrix 10 and/or the connections therebetween.

The configuration memory 19 includes a plurality of banks. For example, as shown in FIG. 1(b), a first function (data flow, circuit design) 17a is configured in the PE matrix 10 by the configuration data 18 stored in a foreground bank of memory 19. A second function 17b and a third function 17c are also respectively configured by the configuration data stored in different background banks of memory 19. By switching between the banks of the memory 19, the second function 17b or the third function 17c is reconfigured in the PE matrix 10 in place of the first function 17a. Such reconfiguring of the PE matrix 10 is carried out dynamically in one cycle (one clock), for example.

As shown in FIG. 1(c), in the reconfigurable device (dynamic reconfigurable device) 1, the PE matrix 10 can be reconfigured (dynamically reconfigured) according to time division so as to realize a plurality of functions (subfunctions) produced by time division of a given application, such as an MPEG decoder. By putting the device 1 to such use, it becomes possible to execute an application that normally requires a large number of hardware resources with fewer hardware resources using the device 1.

Also, as shown in FIG. 1(d), it is possible to reconfigure the PE matrix 10 so as to realize a plurality of functions so as to execute applications with different regeneration methods. By using the device 1 in this way, it is possible to execute many applications using the same hardware (device) 1. Since the device 1 can switch between and implement a large number of functions (multifunction) on a data flow level (data path level, hardware level) and not on a program level (instruction level), it is possible to carry out processing at a speed that matches the speed of special purpose hardware.

Figures 2, 3:
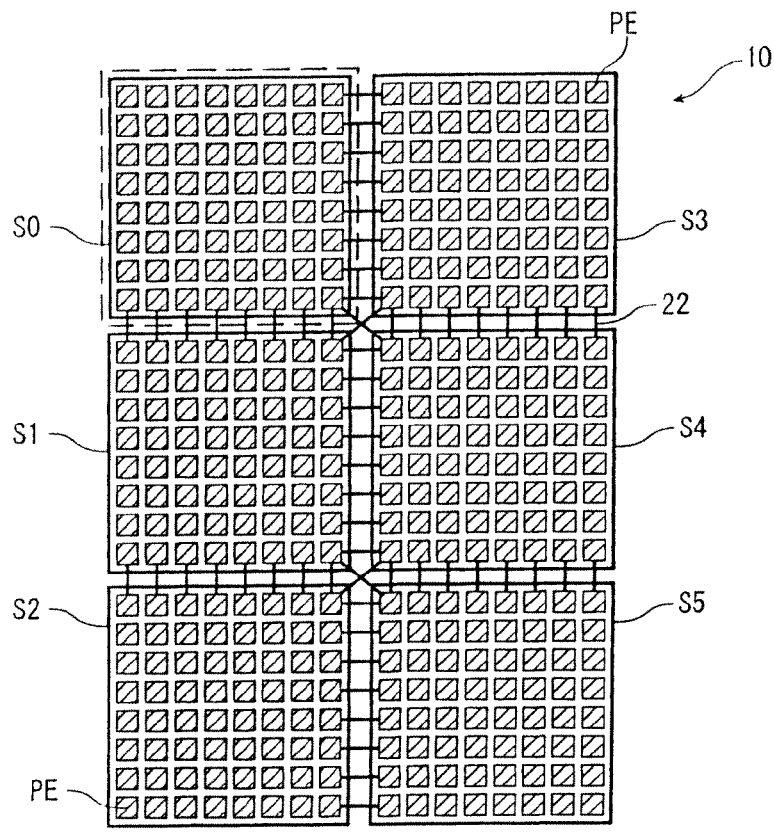
FIG. 2 shows the arrangement of the PE matrix.
FIG. 3 shows the types of PEs placed in the PE matrix.

FIG. 2 shows an enlargement of the arrangement of the PE matrix 10. The PEs are placed so as to construct a 16×24 matrix as a whole. Note that as shown in FIG. 3, a number of the PE actually take up double the space of a single PE so that a total of only 376 PE are placed in the PE matrix 10, but this is not reflected in FIG. 2. The PEs are also grouped into six groups that are each composed of 8×8 PEs. Such groups are referred to as "segments S", with segment 0 (S0) to segment 5 (S5) being placed in order from top left to bottom right in the PE matrix 10. Each PE included within the respective segments S0 to S5 are connected by intra-segment connections (intra-segment interconnections) 21 that are capable of transmitting and receiving data within the range of a delay of one cycle. Out of the segments S0 to S5 also, adjacent segments are connected by inter-segment connections (inter-segment interconnections) 22 via delay elements, described later.

FIG. 3 shows an example of a specific placement of PEs included in the PE matrix 10. Out of the PE shown in FIG. 3, the PEs that start with "EX" include arithmetic calculations, logic calculations, and a two-input compare function called "EXE elements". Unique calculation functions of various types are also included, so that "EXC" is equipped with a CMPSB instruction that carries out a byte comparison, "EXF" is equipped with a FF1 (Find First 1) instruction, "EXM" is equipped with a multiply instruction, "EXR" is equipped with a BREV instruction that carries out a bit reverse, and "EXS" is equipped with a BSWAP instruction that carries out a byte swap.

The PEs that start with letters "DL" are delay elements where a delay of one to eight clocks can be set. "DLE" is an element for delaying data inside a segment, "DLV" is an element for transmitting and receiving data between segments in the vertical direction, "DLH" is an element for transmitting and receiving data between segments in the horizontal direction, and "DLX" is an element for transmitting and receiving data between segments in the vertical and horizontal directions.

The PE matrix 10 further includes "RAM" that is a DNA internal memory, "LDB" that is a DNA internal buffer for data input, "STB" that is a DNA internal buffer for data output, "C16E" that is an address generating element for a DNA internal buffer, "C32E" that is an address generating element for an external memory space, "LDX" that is a data input element for input from a DNA direct I/O, and "STX" that is a data output element for output to a DNA direct I/O.

Figure 4:
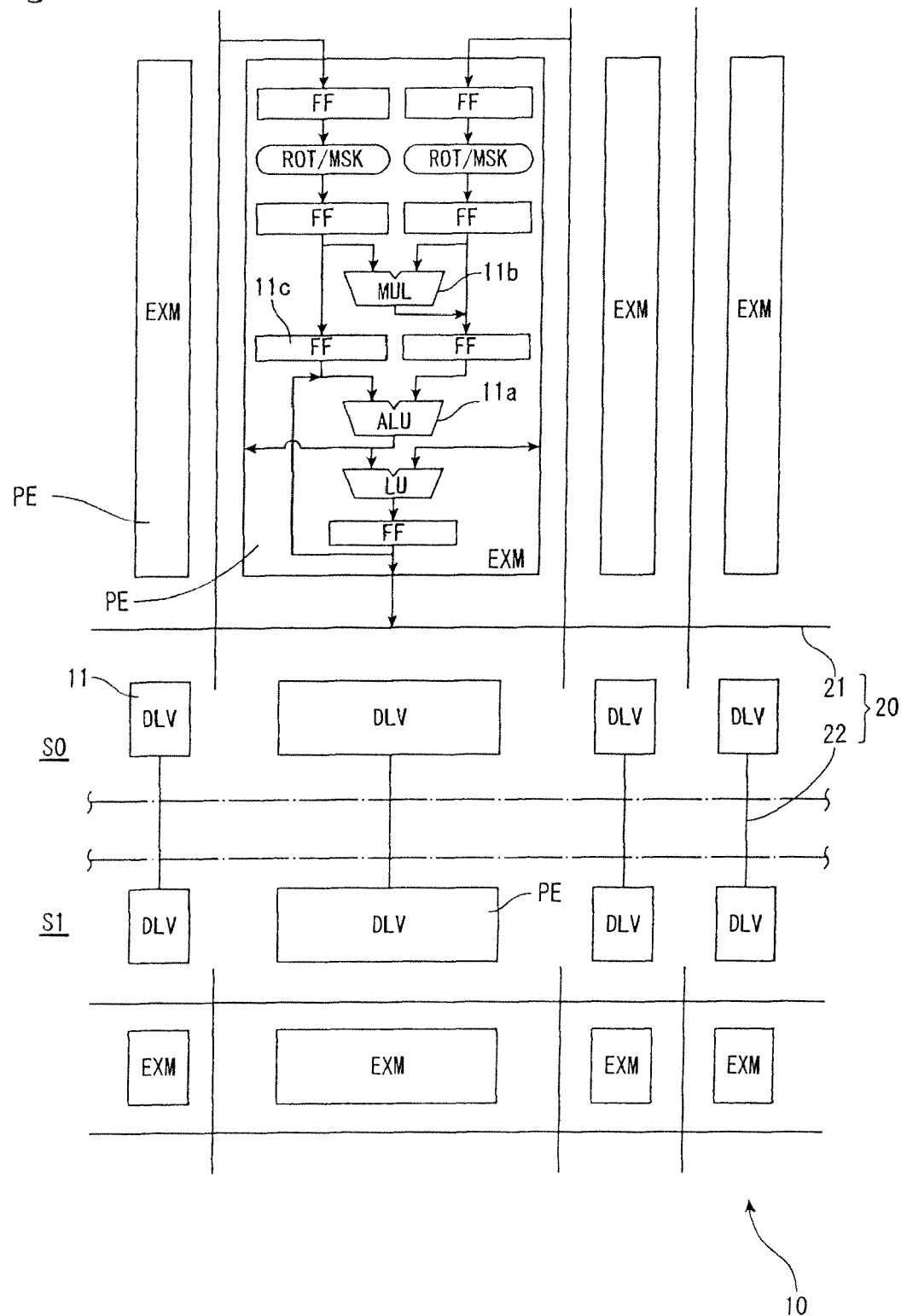
FIG. 4 shows an enlargement of the placement of the PE matrix.

FIG. 4 shows, as one example of a PE, the overall construction of an EXE element ("EXM") that includes an ALU 11a, a MUL (16×16) 11b, an FF 11c, and the like. The "EXM" element can be configured by configuration data 18 stored in the configuration memory 19 of the DNA 3 so as to execute instructions that are one or a combination of an arithmetic calculation, a logic calculation, a two-input compare function, and multiplication. Also, since a plurality of FF 11c are incorporated, it is possible to control the latency from the input of data into the element PE to output, and therefore in a configuration where the number of delay elements (DLE) is insufficient, it is also possible to set the EXM to function as a delay element.

The PE matrix 10 includes a plurality of PE (PEs) and a routing matrix (i.e., wiring group, interconnections) 20 for connecting such PEs. The routing matrix 20 includes a first-level wiring group (a first-level routing matrix, intra-connects, internal segment interconnects) 21 for connecting the PE within the respective segments (each segments S0 and S1 exemplary shown in FIG. 4) and a second-level wiring group (a second-level routing matrix, intra-connects, inter-segment interconnects) 22 for connecting between adjacent segments (between segments S0 and S1 exemplary shown in FIG. 4) via delay elements. The connecting of the PEs by the routing matrix 20 can be controlled by the configuration data 18. Accordingly, in the PE matrix 10, by changing the respective functions of a plurality of PE and/or changing at least some of the connections of the routing matrix 20 via the configuration data 18, it is possible to reconfigure different circuits (data paths, data flows).

Figure 5:
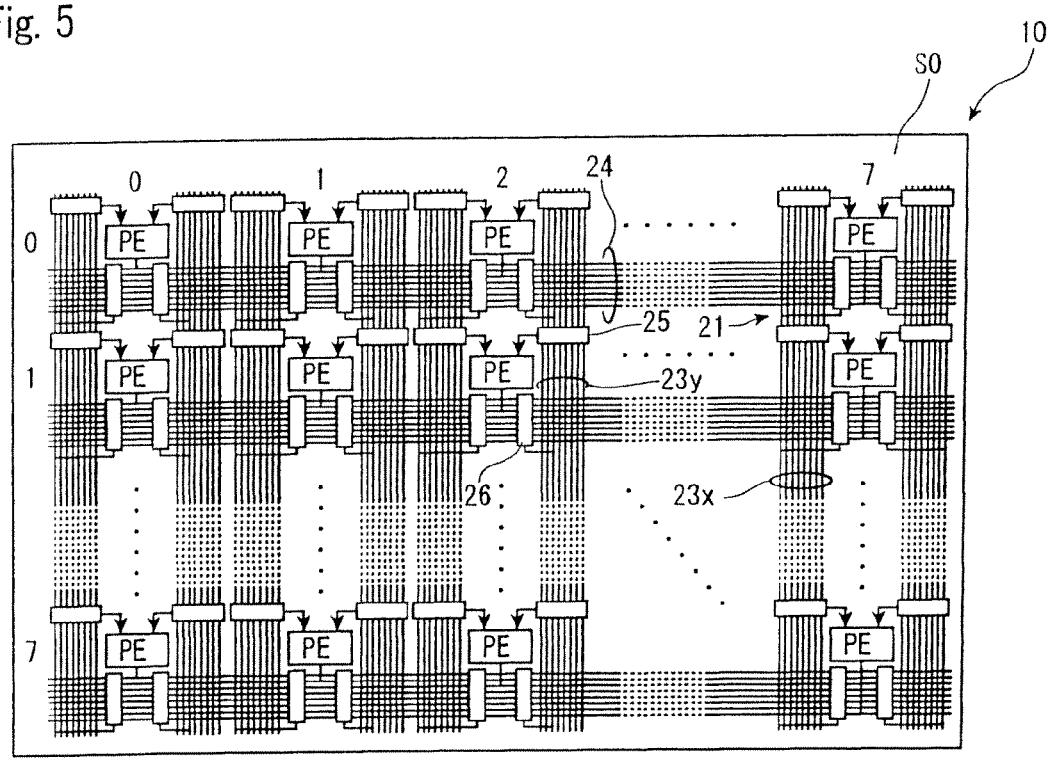
FIG. 5 shows wiring (intra-segment interconnections) inside a segment.

FIG. 5 shows an example of the arrangement (construction) of the first-level wiring group 21 for connecting the PEs inside a segment (segment S0 is exemplary illustrated in FIG. 5). The first-level routing matrix 21 includes 128 vertical-direction buses (V-buses) 23, and 63 horizontal-direction buses (H-buses) 24 to connect the 8×8 PEs included in segment 0 (S0). The vertical-direction buses 23 are divided into sixteen groups and form two V-buses 23x and 23y that respectively include eight buses and are disposed along the vertical columns of the PEs on both sides of the columns. The horizontal buses (H-buses) 24 are divided into eight groups and H-buses 24 that respectively include eight buses are disposed along the horizontal rows (lines) of PEs. 8-1 (8-to-1) bus selectors (multiplexers, MUX) 25 are provided corresponding to the respective PE on the V-buses 23x and 23y so that data can be inputted into the respective PE.

8-1 (8-to-1) bus selectors (multiplexers, MUX) 26 are provided on the H-buses 24 corresponding to intersections between the H-buses 24 and the V-buses 23x and 23y. Accordingly, one data set from an H-bus 24 can be outputted to one V-bus 23x or 23y that intersects or crossing the H-bus 24. Output in the opposite or converse direction is also possible. The respective buses included in an H-bus 24 are connected to the outputs of the PEs on that line. Accordingly, it is possible to connect the PEs included in a segment via the V-buses 23x and 23y and the H-buses 24 variably. Data can be transmitted and received in one cycle (one clock) or less between PEs in a range that can be connected by the first-level buses 21 that include the V-buses 23x and 23y and the H-buses 24. In other words, data can be transmitted and received in one cycle (one clock) or less between the PEs within the respective segments 0 to 5 (S0 to S5). Accordingly, for example, the PEs included in segment S0 are all equivalent in terms of timing. For this reason, within the same segment, no matter which PE is selected and assigned a function when constructing a circuit, it is not necessary to investigate the timing and in terms of timing, it is possible to freely place and route (place and wire) a predetermined circuit using the PEs in a given segment.

Figure 6:
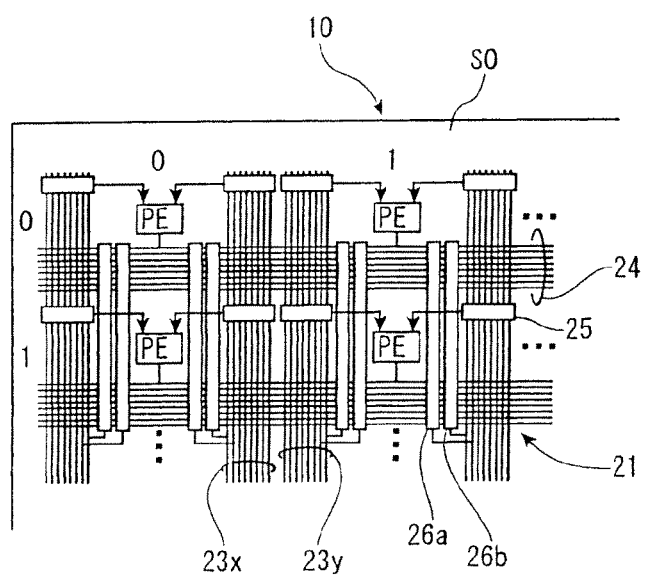
FIG. 6 shows a different example of wiring inside a segment.

FIG. 6 shows the arrangement (construction) of a first-level routing matrix 21 that differs to the above description. In this example, by using two 16-1 (i.e., 16-to-1) MUX 26a and 26b, it is possible to input and output data to one V-bus 23x or 23y from two H-buses 24. Accordingly, from one H-bus 24, it is possible to output a maximum of two data sets to one V-bus 23x or 23y that intersects the H-bus 24. The opposite is also possible. This means there is increased flexibility for connections on the first-level routing matrix 21.

Figure 7:
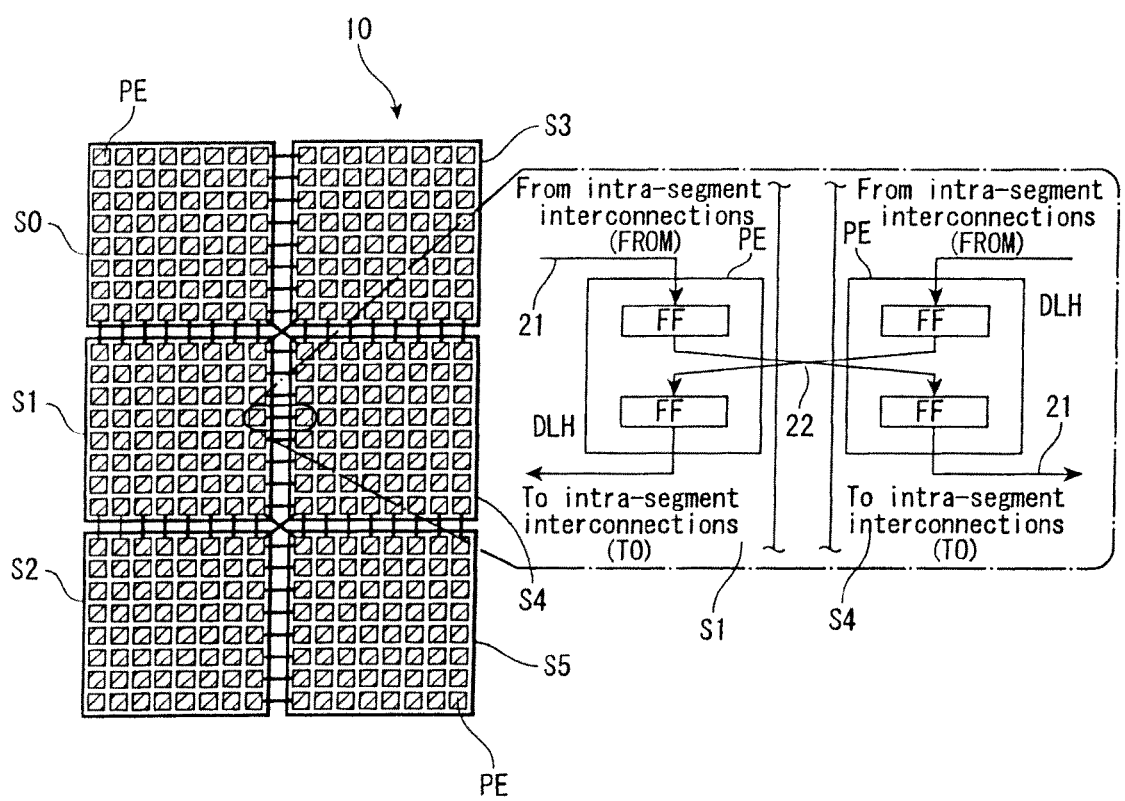
FIG. 7 shows the wiring (inter-segment interconnections) between segments.

FIG. 7 shows the arrangement (construction) of the second-level routing matrix 22. In FIG. 7, connecting elements DLH respectively included in adjacent segments (S1 and S4 exemplary shown in FIG. 7) are connected by the second-level routing matrix 22. The DLH that are enlarged in FIG. 7 are connected to the first-level routing matrix (intra-segment interconnects) 21 inside the respective segments S1 and S4. Accordingly, the PE included in the segment S1 and the PE included in the segment S4 can be connected via the second-level routing matrix (inter-segment interconnects) 22. The connecting delay elements DLH function as an interface for the buses included in the first-level routing matrix 21. Hence, it is possible to use the buses included in the first-level routing matrix 21 independently in each segment. On the other hand, when it is necessary to input and output data between segments, it is necessary to input and output the data via the plurality of "FF" included in the connecting delay elements DLH, and newly add a delay of at least two cycles that are synchronized with the clock.

In this way, when PEs are connected using only the first-level routing matrix 21, it is guaranteed that the PEs can be connected within a range of one cycle (a "first delay"), and therefore it is not necessary to verify the timing. On the other hand, when PEs are connected via the second-level routing matrix 22 (with the first-level routing matrix), a delay of at least two cycles is added. The delay added when connecting via the second-level routing matrix depends on the internal setting of the delay elements DLH. For example, by controlling the internal delay of the DLH, it is possible to synchronize signals that use the second-level routing matrix 22 twice and signals that use the second-level routing matrix 22 once. This is also the same when adjacent segments among the segments S0 to S5 are connected via the other types of connecting delay elements DLV and DLX.

This means that for a circuit that is distributed across a plurality of segments out of the segments S0 to S5, that is, a circuit that spans between segments, it is necessary to adjust and/or reinvestigate the timing during and/or after placing and routing. As a result, there is the possibility that it will be necessary to add delay elements and/or adjust the delay of the delay elements. When a circuit is placed and routed in the PE matrix 10, it is preferable to minimize the use of the second-level routing matrix 22.

Figure 8:
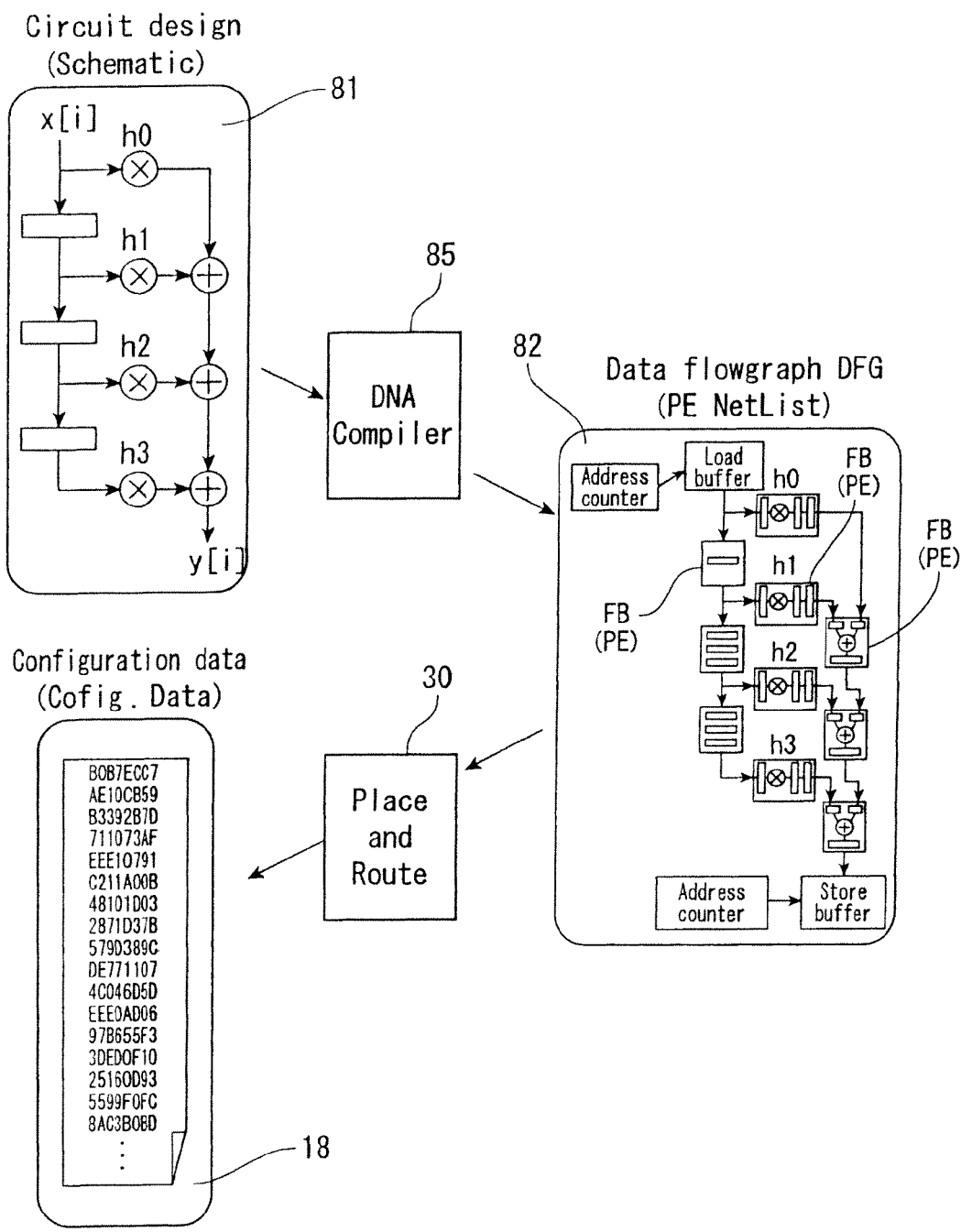
FIG. 8 shows a process that maps a circuit design onto the device.

FIG. 8 shows a procedure that generates the configuration data from a circuit design that has been provided. First, a specification (circuit design) 81 provided as a program in such as C language or a data flow graph (data flowgram) is converted into a PE net list 82 by a DNA compiler 85. The DNA compiler 85 analyzes the specification 81 and generates, as the PE net list 82, a data flow graph where functions to be implemented in the device 1 are expressed as a plurality of functional blocks FB (hereinafter simply referred to as "FB") that can be respectively implemented in the PE and connections between the plurality of functional blocks FB. In this procedure, the DNA compiler 85 investigates not only delays for defining the order of data sets but also the latency of the PE to which the FB are assigned and investigates the timing of data input into the respective FB. After this, FBs that include appropriate delays are inserted into the PE net list 82.

Next, based on the PE net list 82, the configuration data 18 including placement and wiring (routing) information is generated by a system 30 for helping (aiding, supporting, designing) placement and routing. By reconfiguring the PE matrix 10 based on the generated configuration data 18, it is possible to implement the functions required by the circuit design 81 in the device 1 that includes the PE matrix 10.

Figure 9:
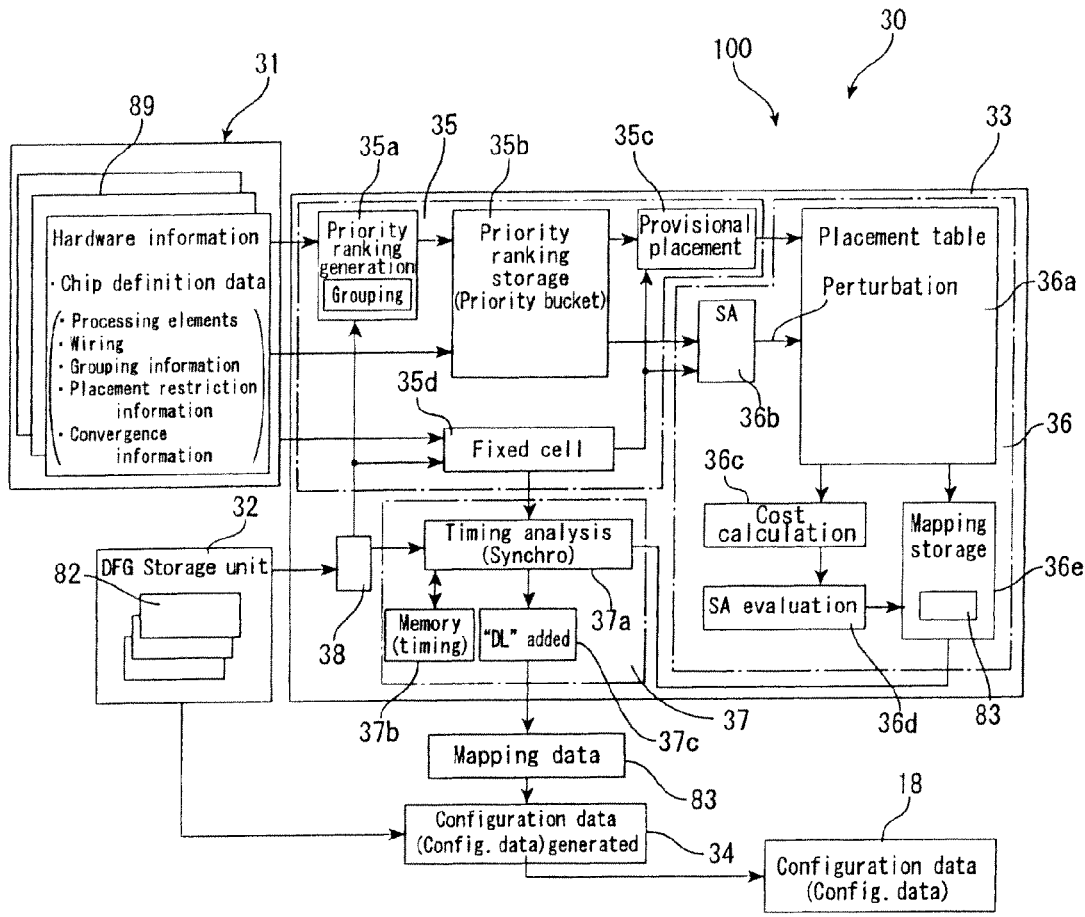
FIG. 9 shows the overall arrangement of a system helping place and routing.

FIG. 9 schematically shows the place and route design aid system 30. The system 30 includes an appropriate storage device such as a hard disk device, a memory, and a calculation processing function including a CPU and others hardware resources that are usually provided as a standard computer 100. The placement and route design helping system 30 is a system for generating the configuration data 18 for configuring the reconfigurable device 1 described above. The system 30 includes a database (first database) 31 for storing hardware information 89, a second database (DFG storage unit) 32 for storing a PE net list of data flow graph-type (hereinafter "DFG") 82, an apparatus (mapping apparatus) 33 for mapping (generating a mapping data of) the DFG 82 onto the device 1, and an apparatus for generating the configuration data 18 based on mapping data 83 and the DFG 82. The configuration data 18 also includes initial setting values and the like.

The hardware information 89 is chip definition data generated for each type of device. For the device 1 described above, the hardware information 89 includes definition data for PEs (segment information, the types, number, placement, and the like of PEs included in the respective segments), definition data for wiring (interconnections) including the first and second-level routing matrices for connecting the PEs, and the like. The system 30 that includes the mapping apparatus 33 is capable of generating a mapping of a circuit design onto a variety of types of device by changing the hardware information 89 of the device to be implemented the circuit design. Also, when a device is changeable the ranges and/or boundaries of the segments according to some conditions such as the operation frequency, by using different hardware information 89 for the respective conditions, it is possible to change the conditions for mapping by the mapping apparatus 33.

The mapping apparatus 33 generates mapping data 83 by mapping a plurality of functional blocks (FBs) included in the DFG 82 onto a plurality of PE. By using the mapping data 83, it is possible to implement the circuit design supplied by the DFG 82 in the device 1. The expression "mapping" in the present specification includes assigning (placing) the FBs included in the DFG 82 in any of the PEs included in the device 1 and/or generating mapping data (assignment information).

The mapping apparatus 33 includes a functional unit 38 that reads the DFG 82 from the database 32 and analyzes the DFG 82, a functional unit 35 for provisionally assigning the FBs included in the DFG 82 to respective PEs out of the PEs grouped (divided) into the segments, a functional unit 36 for mapping the DFG 82 onto the PEs by appropriately changing the assignment of FBs to PEs by carrying out (using) an iterative algorithm that minimizes the cost function CF based on the hardware information 89, and a functional unit 37 for verifying the timing. The mapping functional unit 36 includes a placement table 36a produced by virtually expanding an arrangement of PEs of the PE matrix 10 in the memory of the computer 100, a function 36b that changes the assignment of PEs in accordance with simulated annealing (hereinafter simply "SA" or "S.A."), a function 36c that calculates a cost function (hereinafter, simply "CF"), a function 36d that determines the conditions of the SA, and a function 36e that updates the mapping data 83. As described in detail later, the SA 36b repeatedly changes (perturbs) the assignment of PEs in the placement table 36a a little at a time and calculates the CF.

The function 36c that calculates the CF finds routes for connecting the assigned PEs that are present in the placement table 36a and are PEs to which the FBs have been assigned by the SA and calculates the CF using Equation (1) shown below based on the usage state of the routing matrices 21 and 22 for forming such routes.

$$CF = C1 \cdot F(W\text{-intra}) + C2 \cdot F(W\text{-inter}) \quad (1)$$

The expression F(W–intra) is a function (item, term) for calculating the cost relating to wiring (interconnections) that does not cross over between segments and corresponds to usage of the first-level routing matrix 21. The expression F(W–inter) is a function (item, term) for calculating the cost relating to wiring (interconnections) that crosses over between segments and corresponds to usage of the second-level routing matrix. C1 and C2 are coefficients, and CF greatly reflects variations in the value of the second item, that is, C2·F(W–inter). Accordingly, the mapping function 36 carries out mapping so as to minimize usage of the second-level routing matrix 22.

Simulated annealing (SA) is an example of one of known iterative algorithms for minimizing a CF and can be applied the CF for obtaining a placement. SA is used in problems where various combinations need to be optimized and is an algorithm that is especially successful in solving circuit design problems. SA is a generalization of a Monte Carlo method for enumerating the state of a multi-particle system. According to the original Metropolis method ("Metropolis Monte Carlo"), an initial state of a thermodynamic system is selected according to the energy E and temperature T, and while keeping the temperature T constant, the initial state is perturbed by generating a random number and the change in energy dE is calculated. Based on the change dE, it is decided whether a new state produced by the random number is to be adopted. If the change dE is zero or below, the new state is adopted with a probability of "1", while if the change dE is greater than zero, the new state is adopted with a probability of "EXP(–βdE)". Here, β is a Boltzmann constant. In a process that finds the placement where CF is minimized, the energy E of SA is replaced with the cost function CF and the change dE in energy is replaced with a change or difference dCF in the cost function CF.

SA starts with an optimization according to a Metropolis Monte Carlo simulation at high temperature. This means that out of the state changes due to the generation of a random number, state changes that lead to an increase in energy are recognized with a comparatively high probability. When the Monte Carlo steps have been repeated or attempted for a sufficient number of times, the temperature T is lowered. Such processing is repeated while lowering the temperature T and continuing the Metropolis Monte Carlo simulation until the final temperature T is reached. The SA program includes one set of nested Do loops. Here, the outermost loop sets the temperature and the innermost loop executes a Metropolis Monte Carlo simulation at such temperature. The method for lowering the temperature T is known as a cooling schedule. Typically, two different cooling schedules are mainly used. One is a linear cooling schedule (Tnew=Told–dT). The other is a proportional cooling schedule (Tnew=C×Told, C<0).

The provisional assignment functional unit 35 includes an analyzing function 35a that analyzes the hardware information 89 and the DFG 82 and decides (generates) priority rankings for assigning (placing), a priority ranking storage unit (priority bucket) 35b that stores the result of the analyzing function 35a, an initial placement function 35c that provisionally and randomly assigns the FBs included in the DFG 82 in accordance with the priority rankings to the PEs based on random numbers to obtain a provisional placement (a provisional assignment), and a function 35d that sets an FB whose placement needs to be fixed according to the DFG 82 in a PE at a predetermined location as a fixed cell. The analyzing function 35a generates the priority rankings so as to prioritize FB that can only be assigned to PE that are not numerous out of the plurality of types of PEs placed in the PE matrix 10 and sets such priority rankings as the priority bucket 35b.

The initial placement function 35c randomly assigns the FBs included in the DFG 82 to the PEs of the PE matrix 10 while fundamentally ignoring the segments S0 to S5. The initial placement function 35c also includes a function that randomly places specified FBs on PEs in specified segments. Specified FB is assigned in the SA 36b in the same way to PE out of PEs in a specified segment. In addition, the function 35d assigns specified FB to the PE at predetermined position and the SA 36b does not change the assignment of the PE at predetermined position.

The functional unit 37 that verifies the timing synchronizes a variety of signals that reach (arrive at) the PEs. The timing verifying function 37 includes a timing analyzing function (synchro function) 37a that analyzes the timing of the signals that reach the PEs, the memory 37b for storing the result of analyzing the timing of the DFG 82, and a function 37c that adds delay elements (DL). The function 37c that adds delay elements compares the result of the analyzing function 37a analyzing the circuit configured by the mapping data 83 obtained by the mapping function 36 and the result of the DFG 82 stored in the memory 37b. To obtain the same result as the data flow provided by the DFG 82, appropriate delay elements for synchronizing the signals inputted into the PEs are added to the mapping data 83.

The data flow (data path) configured in the PE matrix 10 of the reconfigurable device 1 is a clock-synchronized (i.e., cycle-synchronized) data flow. Accordingly, to have predetermined processing carried out in the respective PE, delay elements are inserted as necessary into the data flow to synchronize the signals (data sets) that reach the PE. In the present specification, this is referred to as "data synchronization". Data synchronization is necessary according to differences in latency between PE and whether Z conversion calculation is required. The lengths of the delays used for data synchronization also differ on a case-by-case basis. It is preferable to minimize the number of delay buffers when synchronizing a pipelined circuit so as to reduce the number of delay elements that are consumed.

For example, "Minimizing the Number of Delay Buffers in the Synchronization of Pipelined System (DAC'91 in IEEE Transactions on Computer-Aided Design of Integrated Circuits and Systems, Vol. 13, No. 12, December 1994, pp. 1441-1449)" discloses the use of the simplex method of LP (Linear Programming) techniques. LP is a systematic means for solving a request for data synchronization when an input application (alias circuit) is correctly expressed in terms of both the length of the paths and path delays, and can obtain an optimum solution. The simplex algorithm has no guarantee of performance in polynomial time, but normally exhibits much better performance than an integer linear programming approach. In the device 1, for the wiring within a segment, it is possible to ignore delays on paths that connect PEs. Also, for wiring that spans between segments, it is possible to set a delay in cycle units. Accordingly, this method is suited to analyzing data synchronization in the device 1.

The timing analyzing function 37a generates a signal flow graph (SFG) from the DFG 82 and generates a linear equation. If necessary, dummy nodes are inserted, and then the linear equation is inputted into an application program for solving an LP problem using a simplex algorithm to obtain a solution. One example of such application program is called "LPSOLVER". The solution produced by the application program is stored and delay elements can be inserted in accordance with the solution.

Figure 10:
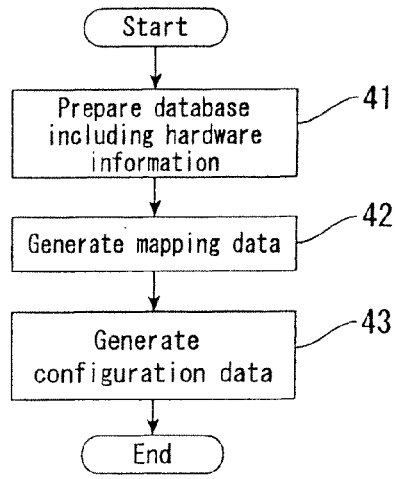
FIG. 10 is a flowchart showing an overview of the processing of the system.

FIG. 10 shows the flow of processing by the placement and routing design aid system 30. In step 41, the first database 31 that stores the hardware information 89 relating to the device 1 is prepared so that it can be used by the computer 100 that constructs the system 30. The hardware information 89 includes data (definition data) of the plurality of PEs included in the respective segments S0 to S5 and data (definition data) of the first and second-level routing matrices 21 and 22. In step 42, the mapping data 83 is generated, and in step 43, the configuration data 18 that includes the mapping data 83 and/or is based on the mapping data 83 is generated.

Figure 11:
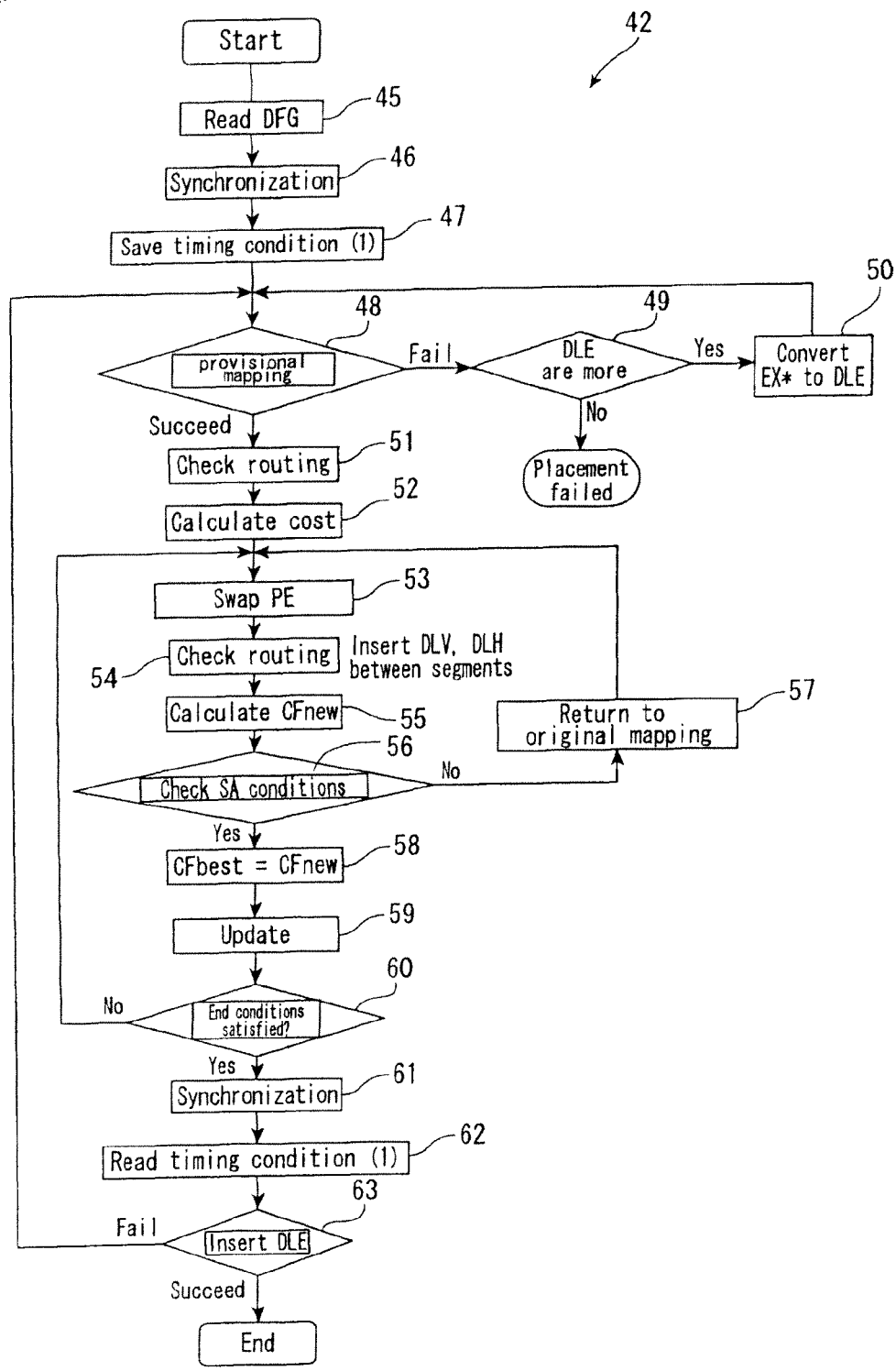
FIG. 11 is a flowchart showing an overview of the mapping process.

FIG. 11 shows the flow of the process 42 that generates the mapping data in more detail. Such process is executed by the computer 100 that operates as the mapping system 33. The processing shown in FIG. 11 is capable of being provided as a program or program product that has been recorded on a suitable medium (a CD, a DVD, or the like). Such program or program product can also be provided via a computer network such as the Internet.

First, in step 45, the DFG 82 for generating mapping data is read from the second database 32 and analyzed. This DFG 82 is a circuit design that is to be implemented in the device 1 by the configuration data (config.data) to be generated. In step 46, the data synchronization is confirmed using the timing analyzing function 37a described above and in step 47, the result (timing condition 1 ("timing cond.(1)") is stored in the memory 37b.

In step 48, a provisional assigning (provisional mapping, provisional placement) of the PEs is carried out using the provisional assignment function 35. The placement of PEs itself in the PE matrix 10 is fixed, and therefore the expression "placing" during mapping or the "placing and routing (wiring)" carried out thereafter refers to changing the functions (FBs) assigned to one or a plurality of such PEs. Also, the function of PE and function of FB assigned thereto correspond, and for that reason expressions such as "interchanging PE" that imply that PE are movable are included in the following description. Such expressions refer to interchanging (or processing for interchanging) the assignment of FB corresponding to PE, and include a reconfiguring of the functions of PE via the configuration data. During the placement and routing design aid for the device 1, "placing" refers not only to physically placing PE but also to placing or setting a plurality of functions (FBs) for realizing the DFG 82 in the PE matrix 10.

FIGS. 12 to 17 show a simple example of a mapping process. The flowchart shown in FIG. 11 will now be described with reference to these examples. FIG. 12 shows a simple example of the PE matrix 10 that has one segment. FIG. 13 is an example of the hardware information 89 that relates to the PE included in the PE matrix 10 shown in FIG. 12. The hardware information 89 includes, in addition to the arrangement of the PE matrix 10, the types 89a of PEs included in the PE matrix 10, instructions 89b that can be implemented in the PEs of the respective types, and the respective numbers 89c of PEs of each type. The priority rankings 89d for placement may also be included in the hardware information 89 or may be added by the mapping system 33.

Figure 14:
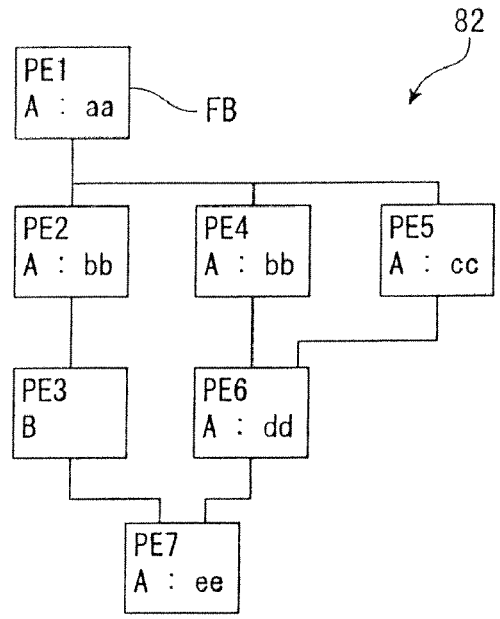
FIG. 14 shows an example of a DFG.
Figure 15:
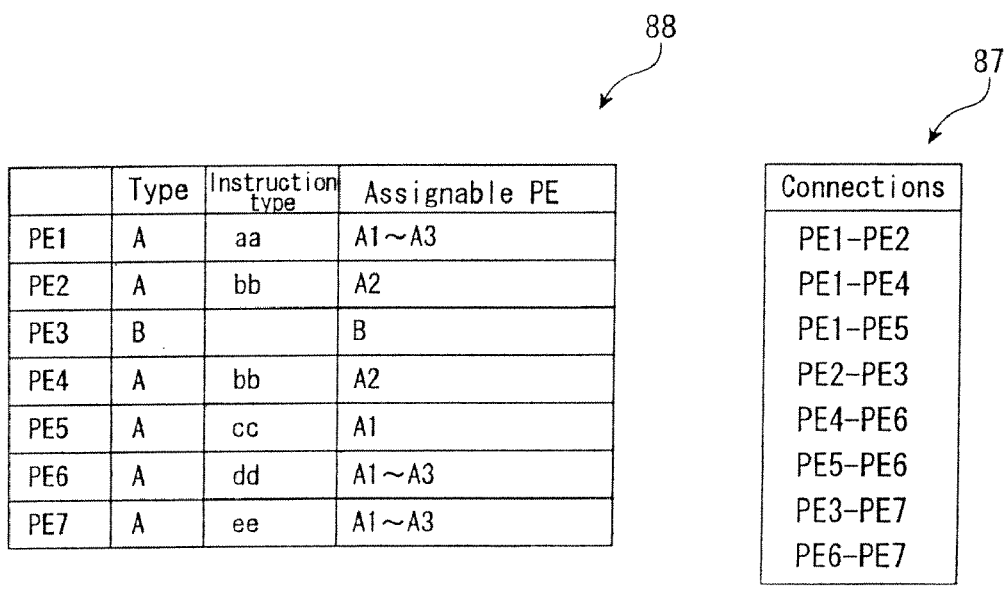
FIG. 15(a) shows an example where the functions of a DFG have been analyzed and FIG. 15(b) shows an example where the connections of the DFG have been analyzed.

In FIG. 14, one example of the DFG 82 is shown. The DFG 82 to be placed and routed (wired) is provided from the user and is stored in the database 32 that is a DFG storage unit. In this DFG 82, the FBs are represented by PE (PE1 to PE7) with functions that correspond to the respective FBs. The analyzing function 38 extracts the FB corresponding to the PE from the provided DFG 82 and also extracts the types and attributes thereof. In addition, out of the FBs included in the DFG 82, a group (fixed arranging group (FAG)) that should preferably be mapped onto the PE matrix 10 using a specified placement of PEs is extracted.

FIGS. 15A and 15B show an example of the result of analyzing the DFG 82. Examples of the analysis result are an instruction type list 88 and a connection relation list 87. In these lists 88 and 87, the FBs are represented by PE1 to PE7 corresponding to the PEs. The extracted instruction types are indices showing which PE in the PE array 10 used for placing can be assigned the FBs. In the present embodiment, as shown in FIG. 13, the hardware used for mapping includes the four types of PE labeled A1, A2, A3, and B and the instructions that can be implemented in a PE include different instructions according to the type of PE.

Here, it is assumed that the combined calculation of the PE2 and PE3 included in the DFG 82 in FIG. 14 (that corresponds to "A2-B" in the PE that can be placed) can only be mapped by a pattern where "B-A2" is consecutive in the vertical direction in the hardware. This type of group corresponds to an FAG and the configuration of PE to be converted into such FAG is included in the hardware information 89. In the PE matrix 10 shown in FIG. 12, the FAG can only be assigned at three positions. Accordingly, at this stage, the FAG obtained by analyzing the DFG 82 is set as the item to be mapped with the highest priority.

In the process in step 48 that determines the provisional mapping, the priority bucket 35b is generated. The priorities at this stage indicate the order used when assigning the FB to the PE on the hardware, and the priority bucket 35b is a list of such priorities. The priorities are defined inside the mapping apparatus 33 and when the number of PE of a given type in the hardware is low, the priority of such type of PE is raised. In the mapping apparatus 33 according to the present embodiment, the hardware information 89 is searched and as shown in FIG. 13, the number of PEs is counted for each type of PEs in the hardware and the types are listed in ascending order of such numbers. The priorities are then set in order from the top of the list.

In addition, in step 48, the assigning of functions to fixed cells (PE whose functions are fixed) is also determined. Mapping positions (PEs) for the Fixed cells are limited (restricted) in the hardware (PE matrix) due to the hardware architecture or due to the user specification for assigning specified FB to specified PE.

Figure 16:
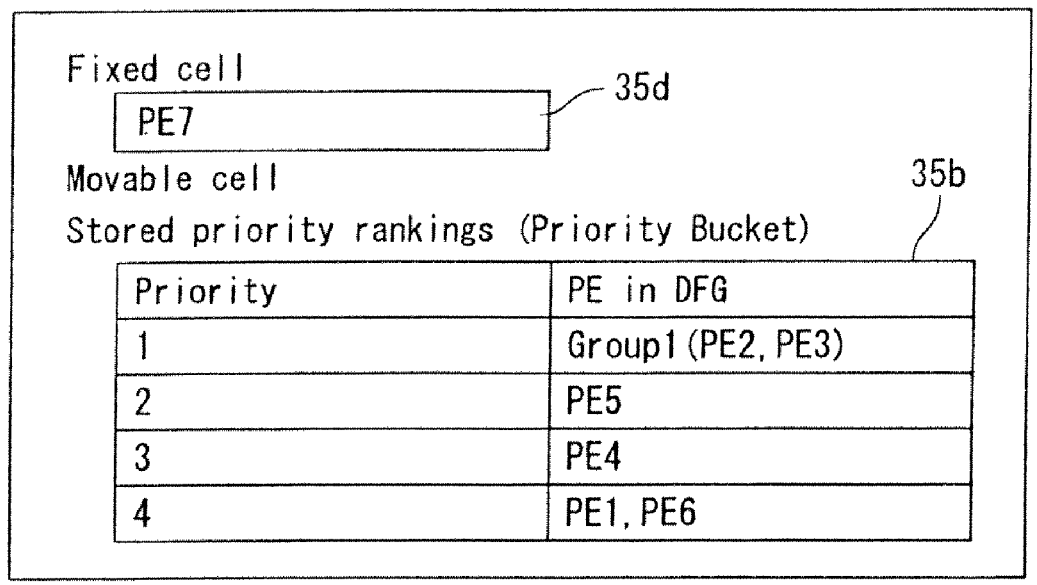
FIG. 16 shows an example of a priority bucket.

FIG. 16 shows one example of a priority bucket 35d. Out of this bucket 35d, PE7 has been designated by the user as a fixed cell and the PE that can be assigned is limited to a position in the fourth row and first column (the coordinates (x,y)=(4,1) in FIG. 12) of the hardware. A movable cell is a cell that has a plurality of potential positions on the hardware. Accordingly, during the SA process, a movable cell corresponds to an FB (a function corresponding to a PE) whose assignment is successively and randomly changeable in a placement that can be mapped onto the PEs of the PE matrix 10. In the example described above, all of the PEs aside from PE7 correspond to movable cells.

For a device with a plurality of segments, it is also possible to fix the segments to be assigned. FBs that are fixed to a specified segment are only successively and randomly assigned within a placement that can be mapped onto the PE of the specified segment in the PE matrix 10 during the SA process.

In the priority bucket 35d shown in FIG. 16, the movable cells are listed up in order of priority for mapping. One of the highest priority is an FAG. The priority ranking of FAG is determined by the number of PE included in FAG as configurable elements. In the present embodiment, FAG is "Group1" only. Accordingly, Group1 is listed up with the highest mapping priority, and assignable (P1, P4 to P6) to the respective PE are listed up next.

In step 48, first the fixed cells are assigned to the PE of the PE matrix 10. In the present embodiment, as shown in FIG. 17A, PE7 is placed at the X-Y coordinates (4,1) of the matrix 10. In addition, the movable cells are assigned to PEs in the PE matrix 10 in order in accordance with the priorities in the priority bucket 35d. The operation of assigning is carried out by randomly selecting assignable PE (PE that can implement the function of an FB to be assigned (i.e., PE where such FB can be placed)). The random placement is determined by generating random numbers and deciding PE to be assigned with an equal probability from the assignable PE. Note that when FB has already been assigned to the PE, the PE at such position is not included in the assignable PE (to be assigned FB).

Next, in accordance with the priority bucket 35d in FIG. 16, Group1 that is an FAG is placed on the PE matrix 10. The location (mapping coordinates) of the FAG is represented by the position of a base cell. In this example, the base cell of the FAG is represented by the coordinates of the top-left cell. In Group1, PE[B] and PE[A2] are placed in a vertical column as FAG. The PE[B] is the base cell and the placement of the group is decided and represented by the position of PE[B]. There are three patterns where Group1 can be mapped with the coordinates expressing the base cell as (2,2), (2,3), and (2,4), respectively. One pattern is selected from the three positions (patterns) where mapping is possible with a uniform probability using a random number. Here, assume that the FAG is assigned to the pattern with the base cell with the coordinates (2,3). According to this decision, PE3 is assigned to the PE with the coordinates (2,2) in the hardware 10 and PE2 is assigned to the PE with the coordinates (3,2). Other FBs are not assigned to the PEs of such positions in subsequent operations.

Next, PE5 that is the FB with the next highest priority is placed by a similar operation. PE5 is an FB that can only be assigned to PE[A1]. Accordingly, there are three PEs (PE positions) that can be assigned in the hardware 10. From these PEs, the position of the PE to be assigned is decided using a random number. In FIG. 17A, PE5 is assigned to the PE with the coordinates (1,4). After this, PE4 that is the FB with the third highest priority is assigned to an appropriate PE. Next, PE1 and PE6 that are the FB with lowest priority are placed. Out of the FBs, PE1, PE6 and PE7 can be placed onto any of the PE[A1], PE[A2], and PE[A3]. PE7 is a fixed cell and has already been assigned to the PE[A3] with the coordinates (4,1). Accordingly, the PE to which PE1 and PE6 are assigned are randomly selected out of PE[A1], PE[A2], and PE[A3] having removed the fixed cells and the already assigned PE as described above. In this operation, the mapping that has been provisionally decided is temporarily stored in a memory.

If all of the FBs included in the DFG 82 could not be provisionally assigned using the PEs of the PE matrix 10, this means that the hardware resources of the PE matrix 10 are insufficient for mapping the DFG 82. Accordingly, before carrying out SA, it is concluded that the DFG 82 cannot be mapped onto the device 1. According to this assigning method, it is possible to decide whether the DFG 82 can be mapped onto the device 1. This is because even when the number of PE to which FB can be assigned is more than sufficient, if the PE to which FB that execute specified instructions are assigned become all used up, it will not be possible to implement the DFG 82 onto the device 1. For this reason, the assigning priorities are decided as described above and critical conditions for assignment that can be predicted are found in advance to improve the usage efficiency of the hardware resources provided in the PE matrix 10.

Using the number of PEs of each type provided in the PE matrix 10, as described above, is one of methods of generating priorities. In this example, the priorities correspond to the number of PEs in the PE matrix 10 that can implement each type of instruction representing the FB. When the number of any of the types of FBs included in the DFG 82 exceeds the number of PEs in the PE matrix 10 that can implement such instruction type, one of the solutions is to change the DFG 82 so as to rewrite an FB of such type to a combination of FBs of other types. Also, one of other solutions is, by converting some PE provided in the PE matrix 10 to a function that is not the original function of such PE, it is possible to compensate for hardware insufficiencies.

In the device 1, a PE expressed as "EX*" for an arithmetic calculation or logic calculation can function as a DLE for realizing only a delay function. When the provisional mapping has failed in step 48, it is confirmed in step 49 whether the cause is an insufficiency of DLE, and if the number of DLE is insufficient, in step 50, remaining EX* are set so that such PE can be used as DLE. After this, step 48 is repeated. If the failure of provisional mapping is not due to an insufficiency of DLE, mapping has failed (i.e., placing has failed), and processing that further investigates the cause of such failure and regenerates the DFG 82 is carried out.

When a provisional mapping is obtained, in step 51, the route for connecting the PEs included in the mapping is checked and in step 52, the cost function CF of Equation (1) is calculated in accordance with such route. Since the hardware (PE matrix) shown in FIG. 12 has only one segment, only the cost related to use of the first-level routing matrix 21 is calculated. The cost due to use of the first-level routing matrix 21 can be found by focusing on the use of the MUX 25 or 26 shown in FIG. 5 or 6.

In this case, CF is described as CFα as shown in Equation (2) below.

$$CF\alpha = F(MUX) \tag{2}$$

When one bus is occupied by a MUX, it is assumed that F(MUX) takes the value 4. Here, MUX shows a penalty relating to use of the wiring. Since the wiring (interconnection) resources are restricted, it is preferable for CFα to be low. For example, if the number of connections from the vertical wires 23x, 23y to the horizontal wires 24 are limited, such as only two connections are possible from the vertical wires 23x, 23y to the horizontal wires 24, depending on the position and conditions of the MUX, the value of F(MUX) should be extremely high such as infinity.

On the other hand, when the same data outputted from a PE is inputted into two PEs connected to the same vertical wires 23x or 23y, the number of buses that will be occupied to input into the two PEs is one. Accordingly, reduced use is made of the routing matrix 21. When mapping is carried out in this way, it is preferable for F(MUX) to fall. For example, the value of F(MUX) is given as (4×½).

In step 52, the mapping cost CFα of FIG. 17(a) is calculated. In this case, there are eight connections (connecting routes) PE1-PE2, PE1-PE4, PE1-PE5, PE2-PE3, PE4-PE6, PE5-PE6, PE3-PE7, and PE6-PE7, and each connection occupies one wire. Accordingly, CFα is given as 32 (4×8). This value is stored in the RAM of the computer 100 that functions as the mapping apparatus 33 and the processing then proceeds to the next step.

In step 53, optimization due to SA is commenced. SA is carried out by finding the optimum value of the cost function by successively changing the assignments in the provisional mapping described above that has been assigned randomly. The basic flow of SA is well-known, and as one example is described in Chen, Tao, "Multi-FPGA Partitioning Using Simulated Annealing" University Of Cincinnati, 2003.

The iterative algorithm that minimizes the CF is not limited to SA. It is also possible to use an iterative algorithm such as mean field annealing or a genetic algorithm. For example, as the simplest heuristic method, it is possible to repeatedly place functions completely randomly to find the mapping with the minimum cost function without considering a cooling rate for temperature or the tolerance for increases in the cost function with a fixed probability. FIGS. 17(b) to 17(e) are useful in explaining the changes in CFα when mapping according to this method. These processes are the same as a constant temperature SA process except in that an increase in CF is tolerated with a fixed probability.

FIGS. 17(b) to 17(e) show examples where mapping is carried out again from the priority bucket 35d onto the hardware (PE matrix) 10 shown in FIG. 12 with the same conditions. Such mapping is carried out by assigning functions with the same conditions, that is, the same priorities, as in FIG. 17(a). Here, aside from the fixed cells, the individual assignments are produced by placing according to random numbers, and therefore a different mapping will normally be obtained compared to a previous mapping.

The CFα of the mapping shown in FIG. 17(b) is 26. Since G1, which includes PE2, and PE4 are placed in the same column, it is possible to use the same interconnections for PE1-PE2 and PE1-PE4. CFα is given as (2+4×6).

At this point, the costs of the previous mapping and the present mapping are compared and when CFα (previous) >CFα (present), the value of CFα is changed to the present value and the present mapping is stored in the RAM. On the other hand, when CFα (previous)<CFα (present), the value of CFα is left unchanged and the mapping is kept at the previous mapping without being updated. For the mapping shown in FIG. 17(b), the condition CFα (previous)>CFα (present) is satisfied. Accordingly, the value of CFα is updated, the mapping is stored in the RAM, and is then used in a comparison with the next mapping as CFα (Best Solution).

During SA, in accordance with the cooling schedule, the above procedure is repeated multiple times for each temperature and the mapping is updated in accordance with the SA conditions. The cost function is recalculated every time mapping is repeated as shown in FIGS. 17(c), (d), and (e). In the case of FIG. 17(c), since the value of CFα increases from 26 to 32, CFα (Best Solution) is not changed. In the case of FIG. 17(d), the value of CFα becomes 22 and therefore CFα (Best Solution) is updated. In FIG. 17(e), since the value of CFα increases to 26, CFα (Best Solution) is not changed. This processing is repeated a predetermined number of times so that the lowest possible value is obtained.

Returning to FIG. 11, in step 53 where SA commences, instead of randomly changing the assigning of all of the PEs again, a limited number of PE (typically one pair of PEs that has been selected randomly) are swapped (interchanged). The process is carried out that randomly selects a PE, assigns the FB assigned to such PE to another randomly selected PE. If an FB has been assigned to another PE, swaps the FBs respectively assigned to the PE and another PE. For a device 1 that has a plurality of segments, this swapping process includes movement (i.e., reassigning) between segments for movable cells, if movement between segments is permitted for such movable cells.

In step 54, the routing (i.e., connection routes) are checked and the cost function CF (CFnew) is calculated in step 55. At the stage (step 54) where the routing is checked, DLV and DLH that correspond to the inter-segment connections 22 are automatically assigned for routes that span between segments or cross over segments.

In step 56, if the new mapping satisfies the SA conditions, in step 58 the value of CF is updated (i.e., CFbest is updated to CFnew), and in step 59, the mapping (i.e., the mapping data) is updated. The updated mapping data becomes base of the configuration data. On the other hand, if the new mapping does not satisfy the SA conditions, in step 57 the original mapping is selected, the processing returns to step 53, and another interchanging of the assignments of PEs is carried out.

One of the SA conditions is that if the change dCF in CF is equal to or below zero, the new mapping is adopted. Another one of the SA conditions is that if the change dCF is greater than zero, "exp(−dCF/temp)" is calculated as the acceptable probability (AP) and the new mapping is adopted if the value of AP is larger than a random number generated at this time. When an option is applied to further promote changes to the mapping, the temperature factor is omitted and AP is calculated as "exp(−dCF)".

SA is repeated until the end conditions are satisfied. The end conditions are that the temperature has reached a predetermined value and repeated mapping at such temperature has been completed. One example of the cooling schedule has an initial temperature T0 of 10000 and an end temperature Tn of 0.1, and the nth cycle (where n is an integer) when the end temperature Tn has been reached is the final cycle. The temperature Ti of the ith cycle out of the n cycle is given by the following equation.

$$Ti = T0(Tn/T0)^{1/n} \quad (3)$$

The number of repetitions for changing the mapping in each cycle is gradually increased. For example, the number of repetitions in cycle 0 is ten and increases by 1.2 times in each cycle thereafter.

When optimization according to SA has ended, in step 61 data synchronization for the optimized mapping is analyzed by the timing analyzing function 37a. In step 62, a comparison with the data synchronization of the DFG 82 stored in the memory 37b is carried out. In step 63, DLE that are required for data synchronization are inserted. If there is a sufficient number of DLE remaining and the insertion of DLE is successful, the optimization of the mapping according to SA ends. When the number of DLE is insufficient, the processing returns to step 48 and is repeated started from the generation of a provisional mapping. Since this is a random process, there is the possibility that different results will be obtained. If there is a clear insufficiency of PE, it is also possible to repeat the processing from the generation of the DFG 82.

Figure 18:
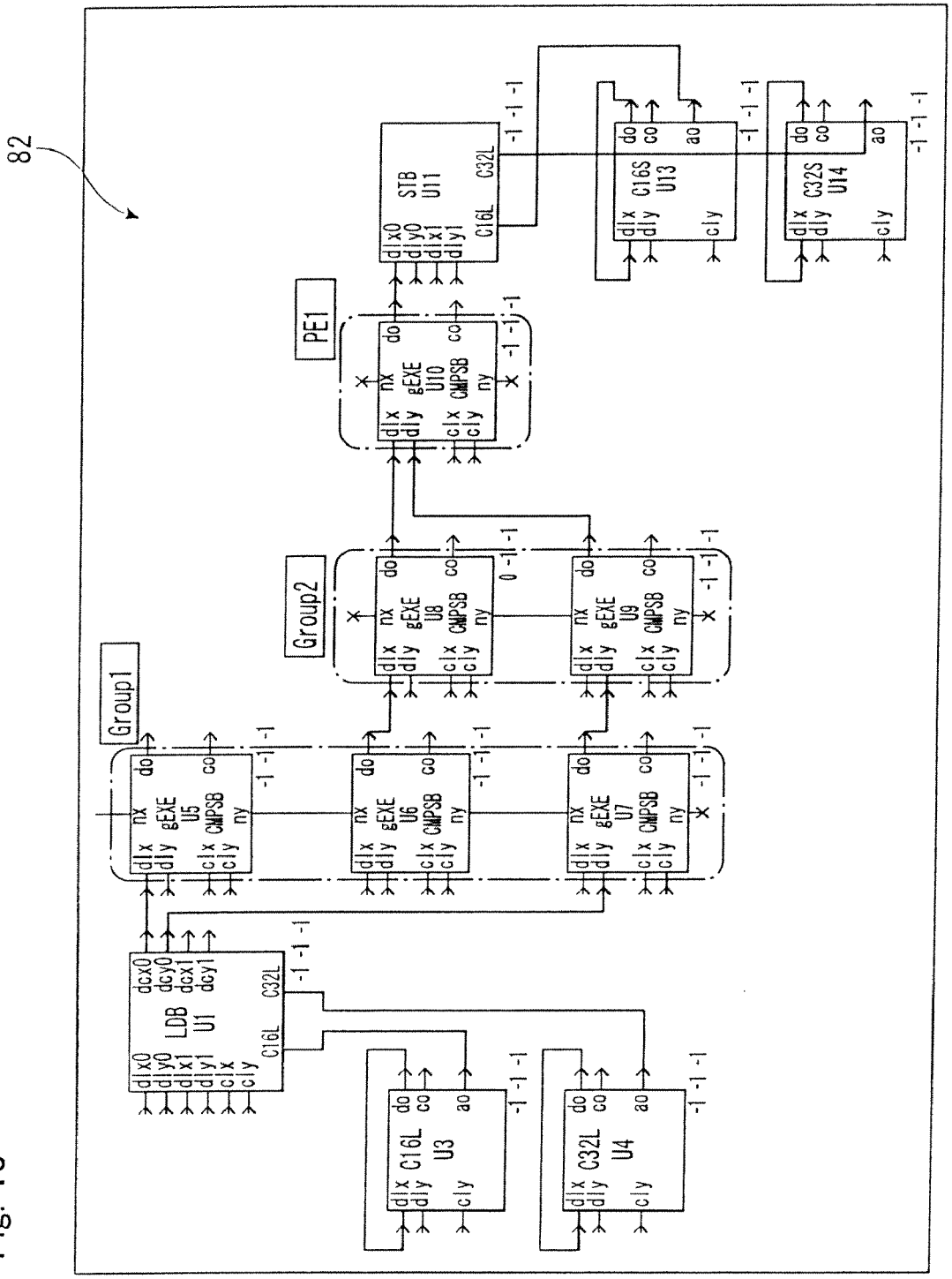
FIG. 18 shows a different example of a DFG.

FIGS. 18 to 23 show an example of mapping onto the device 1. FIG. 18 shows the DFG 82 to be mapped. The DFG 82 includes fourteen FBs numbered U1 to U14 to be assigned to PEs. The connections di, do in the DFG 82 respectively show data inputs and outputs. The connections ci, co respectively show inputs and outputs of carry signals. In addition, the connections nx, ny show outputs and inputs of signals in the direction ny→nx between PE that are adjacent in the hardware as shown in FIG. 18. As described above, the PEs that are connected by the connections ny and the connections nx need to be connected in the same horizontal row in the hardware. For this reason, in the priority bucket, the group selected as the FAG is groups of PEs connected by the ny→nx connections.

This DFG 82 includes group 1 and 2 those are the FAG. The base cell of each group is defined as a PE that is positioned at the leftmost location in the hardware and has an output connection to the ny connection but does not have an input connection to the nx connection. Group1 includes U5, U6, and U7, with U5 as the base cell. Group2 includes U8 and U9, with U8 as the base cell.

In addition, the instructions that can be set in the FB (U5 to U10) assigned to the respective PE are all CMPSB, and the only PE that is capable of being assigned such instruction is "EXC".

Figure 19:
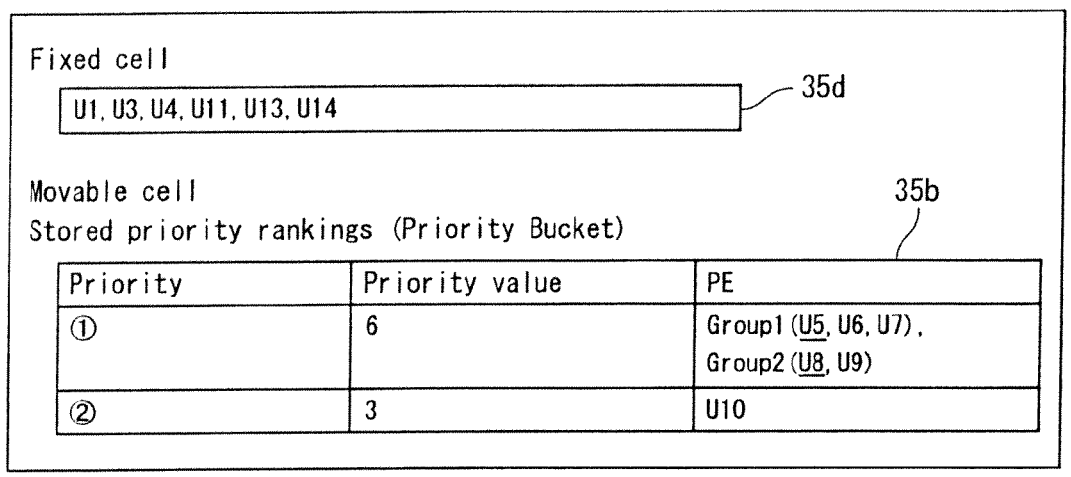
FIG. 19 shows a different example of a priority bucket.

FIG. 19 shows the priority bucket 35b generated corresponding to the DFG 82 shown in FIG. 18. In this example, the priorities are not merely assigned in order depending on the numbers of the respective types of PE included in the PE matrix 10, but are also upgraded according to whether an FB is the base cell of the FAG. For example, if the priority for each type of PE corresponding to EXC is "3", the priority of an FAG where EXC is the base cell is "6". The priority of each type of PE is set so that a PE type where the number of PE provided in the PE matrix is low has a high priority. The priority of another type of PE where the number of such PE provided in the PE matrix 10 is high is lower than the priority of EXC, and if the priority of such PE is "2", for example, the priority of an FAG that has this type of PE as a base cell is set at "4".

Out of the PEs, the FBs assigned to the LDB, C16L, C32L, STB, C16S, and C32S-type PE, that is, U1, U3, U4, U11, U13, and U14 are treated as fixed cells. Accordingly, the remaining FBs are treated as movable cells.

Figure 20:
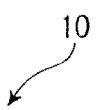
FIG. 20 shows an example where the DFG shown in FIG. 18 has been provisionally mapped onto the PE matrix shown in FIG. 3 in accordance with the priority bucket shown in FIG. 19.

FIG. 20 shows the result of provisionally mapping the priority bucket shown in FIG. 19. When calculating CF as shown in Equation (1), the value relating to the C1·F(W−intra) is set at four per consumption of one MUX and the value relating to the C2·F(W−inter) is set at six per consumption of one crossing (intersecting, spanning) interconnection between the segments. The CF of this mapping is calculated with the intra-segment cost that is the first item (term) as (4×7) and the inter-segment cost that is the second item (term) as (6×7), giving a total of 70 as shown below.

$$CF = (4 \times 7) + (6 \times 7)$$

As described above, in the device 1 that has a segmented architecture, the interconnection that crosses between segments is designed so that the timing of signals is maintained by delay elements disposed at the boundaries between the segments. Accordingly, the interconnection within segments has fewer delays and a lower consumption of delay elements than the interconnection that crosses segment boundaries. To fit the circuits design onto this architecture, the use of the inter-segment interconnection, that is, the second-level routing matrix is set so as to have a larger penalty in the CF.

More specifically, for the mapping shown in FIG. 20, two wires within the segment are used to connect LDB and Group1 that is the start of circuits and is composed of three PEs (EXCs). Connection between Group1 composed of the three PE and Group2 composed of two PE has (two) internal wires within the segment for transferring the output from Group1 and (two) crossing wires between segments at two places for reaching Group2. Connection between Group2 and another EXC has (two) internal wires within the segment for transferring the output from Group2 and (two) crossing wires between segments at one place for reaching the other EXC. Also, connection between the other EXC and STB has (one) internal wire within the segment that transfers the output from the other EXC and (one) crossing wire between segments at one place and reaches STB.

Figure 21:
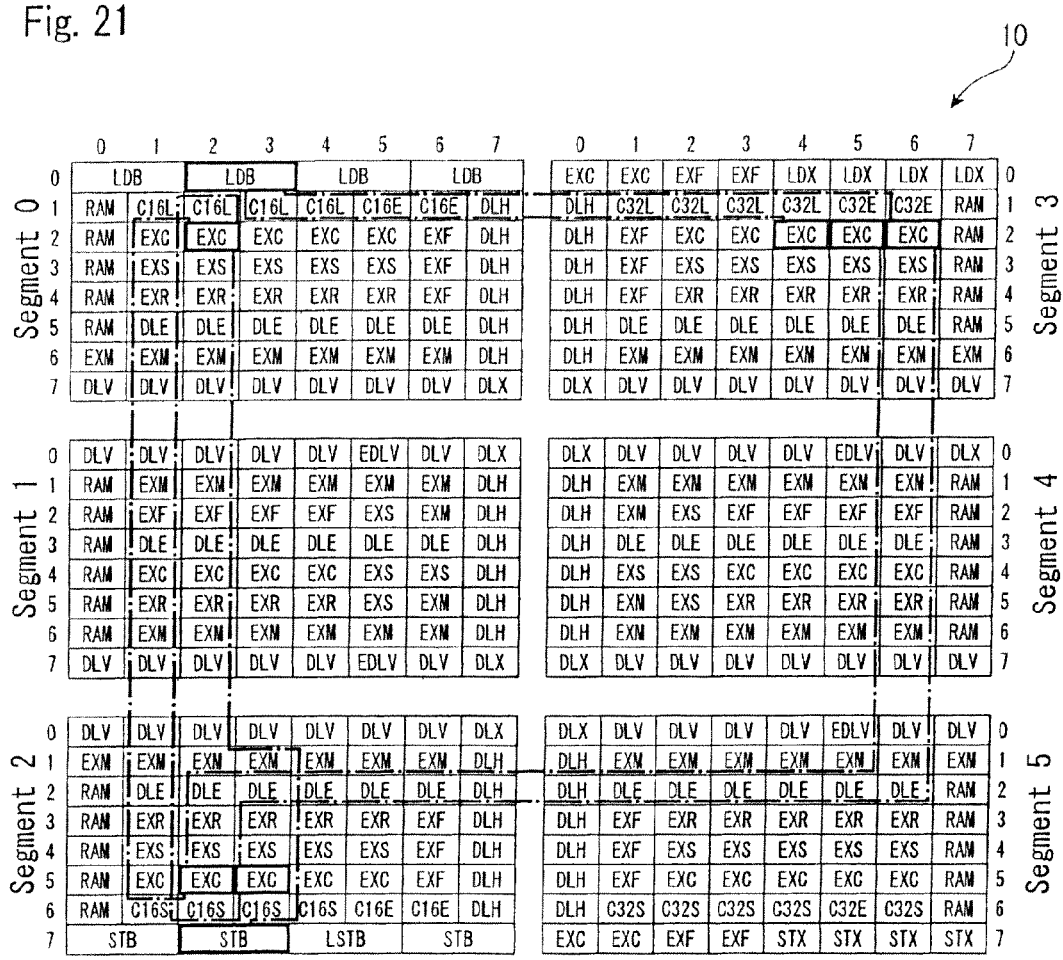
FIG. 21 shows an example of mapping obtained by an SA process.
Figure 22:
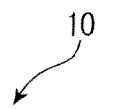
FIG. 22 shows a different example of mapping obtained by the SA process.

The mappings shown in FIGS. 21 to 23 are a number of example mappings that can appear during the SA process. Since the CF of the mapping shown in FIG. 21 increases to 112, so long as the increase in CF is not within the tolerated probability, such mapping will not be used. On the other hand, since the CF falls for the mapping shown in FIG. 22 or FIG. 23, such mappings will be used if they appear in the given order.

In the device 1, the PEs that are placed in the PE matrix 10 are divided into a plurality of segments S0 to S5 and the PEs within the respective segments are connected by a first-level routing matrix (wiring matrix wiring group, or interconnections) so that a signal will arrive within one cycle. Accordingly, when placing (assigning) within one segment, it is not necessary to consider delays or timing errors due to varying routings within the segment. On the other hand, segments are connected by a second-level routing matrix 22 that includes delay elements (DLV, DLH, or DLX). This means that although delays are added due to the interconnection between segments, the amounts of such delays can be controlled using the delay elements and the timing of signals can be guaranteed within the range of such delays.

In the device 1, since the timing of signals is guaranteed within the range of the first-level routing matrix that connects PEs within a segment, for a new mapping generated by a random process, it is not necessary to verify the timing of signals every time a new mapping is generated. In the range of the second-level routing matrix, although there is an increase in the delay, the timing is guaranteed in a predetermined range, and therefore any adjustment of timing is within a range that can be solved by adding delays. For this reason, after the mapping has been optimized, it is sufficient to investigate whether it is necessary to add delays. Accordingly, for the second-level routing also, it is not necessary to verify the timing or verify the critical paths every time a new mapping is generated. This means that in a process where SA is repeated, although it is necessary to investigate the routing to obtain the cost function, it is not necessary to verify the timing, and therefore the time required to optimize a mapping using SA is reduced.

I some replacements of the elements included in a mapping is required during a process of verifying timing closure based on an optimized mapping, efficiency of optimizing a mapping using SA would be not so high. However, in the process described above, for an optimized mapping, data synchronization can be performed by adding delay elements if necessary, and replacement of the elements may not be required. The adjustment of timing for implementing the DFG, if required, the timing differences are fundamentally occurs due to routing that crosses between segments, and such adjustments should be solved using by adjusting the amounts or lengths of the delays in the DLV, DLH, or DLX, if the amounts of delays covered by such elements are enough, included in the second-level routing matrix. Therefore, for adjusting the timing difference, it may not be necessary to newly assign DLE.

Also, regarding an amount of the routing spans or crosses between segments, since usage of the second-level routing matrix 22 is minimized in the process of optimizing the mapping according to SA, it is possible to suppress increases in the lengths of the delays due to usage of the second-level routing matrix. Note that the expression "optimization" here refers to selecting a mapping so that the value of the item that reflects usage of the second-level routing matrix included in the CF (i.e., the second item in Equation (1) described above) is reduced. An iterative algorithm that includes SA is a heuristic method for optimizing a mapping, but this does not mean that a mapping with the minimum usage of the second-level routing matrix will necessarily be discovered out of all of the mappings that can be implemented in the PE matrix. However, there is a sufficiently high probability that a mapping with minimum or close to minimum usage of the second-level routing matrix will be discovered or generated using the above method and the system.

In addition, the CF also includes the item that suppresses usage of the first-level routing matrix 21. Accordingly, during the SA process described above, usage of the first-level routing matrix 21 is also suppressed, and it is possible to improve the usage efficiency of the hardware resources relating to routing that are included in the PE matrix.

As described above, segmentation is suited to improving the freedom of placing and routing in the ranges of the respective segments. In addition, by segmenting a PE matrix, it becomes possible to independently use the buses and/or interconnections (routing matrix) for transmitting and receiving signals in each segment, which has the advantage of making it possible to increase the usage efficiency of the buses and/or interconnections. An architecture where the PE are divided into segments may also be applied to a reconfigurable device including a plurality of PE or functional blocks (LCB) that have uniform functions or close to uniform functions such as ALU elements. Also, among devices with a routing matrix of a uniform arrangement, such as where vertical and horizontal wires are repeated, in devices where the routing matrix can be segmented by a method such as switching or introducing high-resistance elements, it is thought possible to apply the mapping method described above by virtually defining a first-level routing matrix and a second-level routing matrix. Also, the mapping method described above is not limited to a routing matrix that transmits signals according to electric or electronic methods and the routing matrix may use other information transmitting methods such as optical methods. The placement of PEs is also not limited to a regular horizontal and vertical arrangement in two dimensions. It is also possible to place PEs regularly in three or six directions, for example. In addition, by using a multilayer structure or the like, it is also possible to place PEs in three dimensions.

The invention claimed is:

1. A system for generating configuration data for reconfiguring a reconfigurable device,
    wherein the device includes a plurality of processing elements and a routing matrix for connecting the plurality of processing elements and is reconfigured by changing functions of respective processing elements in the plurality of processing elements and/or changing at least some connections of the routing matrix,
    the plurality of processing elements are divided into a plurality of groups, processing elements included in each group are connected in a range of a first delay by a first-level routing matrix included in the routing matrix, and processing elements included in different groups are connected with a different delay to the first delay via a second-level routing matrix included in the routing matrix, and
    the system comprises:
    a database for storing hardware information that includes definition data for the plurality of processing elements included in respective groups and definition data for the routing matrix; and
    a mapping apparatus that is generative a mapping of a circuit design onto the plurality of processing elements for implementing the circuit design in the device by the configuration data,
    wherein the mapping apparatus generates the mapping of the circuit design onto the plurality of processing elements by carrying out an iterative algorithm that minimizes a cost function based on the hardware information, the cost function including an item that minimizes usage of the second-level routing matrix,
    wherein the circuit design includes a data flow graph in which functions to be implemented in the device are expressed as a plurality of functional blocks that are capable of being implemented in processing elements out of the plurality of processing elements and connections between the plurality of functional blocks, the plurality of functional blocks including a plurality of types of functional block, and the plurality of processing elements including a plurality of types of processing element that configurable respectively correspond to restricted types of functional block out of the plurality of types of functional block, and
    wherein the mapping apparatus includes:
    a functional unit that provisionally assigns the plurality of functional blocks to processing elements out of the plurality of processing elements divided into the plurality of groups, and includes a function that assigns the plurality of functional blocks with priority given to a type of processing element with a low number of elements included in the plurality of processing elements out of the plurality of types of processing element, and when doing so, assigns a plurality of functional blocks that can be assigned to a plurality of processing elements of a first type randomly to the plurality of processing elements of the first type; and
    a functional unit that changes assignments of the plurality of functional blocks to the plurality of processing elements using the iterative algorithm, and includes a function that finds a value of the cost function based on a route that connects a plurality of assigned processing elements that have been respectively assigned the plurality of functional blocks.

2. The system according to claim 1,
    wherein the mapping apparatus further includes:
    a functional unit that analyzes the data flow graph and stores timing of inputs and/or outputs of data to and from the plurality of functional blocks in a memory; and
    a functional unit that analyzes connections between the plurality of assigned processing elements including delays due to passing the second-level routing matrix, and assigns delays for realizing the timing stored in the memory to processing elements out of the plurality of processing elements.

3. The system according to claim 1,
    wherein the functional unit that provisionally assigns the plurality of functional blocks further includes a function that randomly assigns first specified functional blocks included in the plurality of functional blocks to processing elements out of a plurality of processing elements in a specified group out of a plurality of groups before randomly assigning functional blocks to processing elements out of the plurality of processing elements of the first type, and
    the functional unit that changes the assignments further includes a function that changes assignments of the first specified functional blocks to processing elements out of the processing elements in the specified group.

4. The system according to claim 3,
    wherein the functional unit that provisionally assigns the plurality of functional blocks further includes a function that assigns second specified functional blocks included in the plurality of functional blocks to specified processing elements out of the plurality of processing elements before randomly assigning functional blocks to processing elements out of the plurality of processing elements in the specified group, and the functional unit that changes the assignments further includes a function that does not change assignments of the second specified functional blocks.

5. A system for generating a mapping of a circuit design onto a plurality of processing elements of a reconfigurable device for implementing the circuit design in the device by configuration data, wherein the device includes a plurality of processing elements and a routing matrix for connecting the plurality of processing elements and is reconfigured by changing functions of respective processing elements in the plurality of processing elements and/or changing at least some connections of the routing matrix, the plurality of processing elements are divided into a plurality of groups, processing elements included within each group are connected in a range of a first delay by a first-level routing matrix included in the routing matrix, and processing elements included in different groups are connected with a different delay to the first delay via a second-level routing matrix included in the routing matrix, the circuit design includes a data flow graph in which functions to be implemented in the device are expressed as a plurality of functional blocks that are capable of being implemented in processing elements out of the plurality of processing elements and connections between the plurality of functional blocks, the plurality of functional blocks including a plurality of types of functional block, and the plurality of processing elements including a plurality of types of processing element that configurable respectively correspond to restricted types of functional block out of the plurality of types of functional block, and the apparatus that generates the mapping of the circuit design onto the plurality of processing elements by carrying out an iterative algorithm that minimizes a cost function based on hardware information that includes definition data for the plurality of processing elements included in respective groups and definition data for the routing matrix, the cost function including an item that minimizes usage of the second-level routing matrix, the apparatus including:

a functional unit that provisionally assigns the plurality of functional blocks to processing elements out of the plurality of processing elements divided into the plurality of groups, and includes a function that assigns the plurality of functional blocks with priority given to a type of processing element with a low number of elements included in the plurality of processing elements out of the plurality of types of processing element, and when doing so, assigns a plurality of functional blocks that can be assigned to a plurality of processing elements of a first type randomly to the plurality of processing elements of the first type; and a functional unit that changes assignments of the plurality of functional blocks to the plurality of processing elements using the iterative algorithm, and includes a function that finds a value of the cost function based on a route that connects a plurality of assigned processing elements that have been respectively assigned the plurality of functional blocks.

6. A method of generating configuration data for reconfiguring a reconfigurable device, wherein the device includes a plurality of processing elements and a routing matrix for connecting the plurality of processing elements and is reconfigured by changing functions of respective processing elements in the plurality of processing elements and/or changing at least some connections of the routing matrix, the plurality of processing elements are divided into a plurality of groups, processing elements included in each group are connected in a range of a first delay by a first-level routing matrix included in the routing matrix, and processing elements included in different groups are connected with a different delay to the first delay via a second-level routing matrix included in the routing matrix, and the method comprises:

preparing hardware information on a computer accessible database, the hardware information including definition data for the plurality of processing elements included in respective groups and definition data for the routing matrix; and mapping a circuit design onto the plurality of processing elements for implementing the circuit design in the device by the configuration data, by having the computer carry out an iterative algorithm that minimizes a cost function, wherein the cost function includes an item that minimizes usage of the second-level routing matrix, the circuit design includes a data flow graph in which functions to be implemented in the device are expressed as a plurality of functional blocks that are capable of being implemented in processing elements out of the plurality of processing elements and connections between the plurality of functional blocks, and the plurality of processing elements include a plurality of types of processing element configurable respectively correspond to restricted types of functional block out of the plurality of types of functional block, and the step of mapping includes:

provisionally assigning the plurality of functional blocks to processing elements out of the plurality of processing elements divided into the plurality of groups; and changing assignments of the plurality of functional blocks to the plurality of processing elements using the iterative algorithm, the step of changing the assignments including finding a value of the cost function based on a route that connects a plurality of assigned processing elements that have been respectively assigned the plurality of functional blocks wherein the plurality of functional blocks include a plurality of types of functional block, and wherein the step of provisionally assigning further includes assigning the plurality of functional blocks with priority given to a type of processing element with a low number of elements included in the plurality of processing elements out of the plurality of types of processing element, and when doing so, assigning a plurality of functional blocks that can be assigned to a plurality of processing elements of a first type randomly to processing elements out of the plurality of processing elements of the first type.

7. The method according to claim 6, wherein the step of mapping the circuit design further includes:

analyzing the data flow graph and storing timing of inputs and/or outputs of data to and from the plurality of functional blocks in a memory; and analyzing, after changing the assignments, connections between the assigned plurality of processing elements including delays due to passing the second-level routing matrix, and assigning delays for realizing the timing stored in the memory to processing elements out of the plurality of processing elements.

8. The method according to claim 6, wherein the step of provisionally assigning further includes randomly assigning first specified functional blocks included in the plurality of functional blocks to processing elements out of the plurality of processing elements in a specified group out of a plurality of groups with priority over the step of random assignment to processing elements out of the plurality of processing elements of the first type, and the step of changing the assignments further includes changing assignments of the first specified functional blocks to processing elements out of the plurality of processing elements in the specified group.

9. The method according to claim 8, wherein the step of provisionally assigning further includes assigning second specified functional blocks included in the plurality of functional blocks to specified processing elements out of the plurality of processing elements with priority over the step of randomly assigning to processing elements out of the plurality of processing elements of the specified group, and a step of changing the assignments further includes not changing assignments of the second specified functional blocks.

10. A method that includes mapping a circuit design onto a reconfigurable device by using a computer, wherein the device includes a plurality of processing elements and a routing matrix for connecting the plurality of processing elements and is reconfigured by changing functions of respective processing elements in the plurality of processing elements and/or changing at least some connections of the routing matrix, the plurality of processing elements are divided into a plurality of groups, processing elements included in each group are connected in a range of a first delay by a first-level routing matrix included in the routing matrix, and processing elements included in different groups are connected with a different delay to the first delay via a second-level routing matrix included in the routing matrix, the circuit design includes a data flow graph in which functions to be implemented in the device are expressed as a plurality of functional blocks that are capable of being implemented in processing elements out of the plurality of processing elements and connections between the plurality of functional blocks, and the plurality of processing elements include a plurality of types of processing element configurable respectively correspond to restricted types of functional block out of the plurality of types of functional block and the mapping comprising:

provisionally assigning the plurality of functional blocks to processing elements out of the plurality of processing elements divided into the plurality of groups; and changing assignments of the functional blocks to the plurality of processing elements using an iterative algorithm that minimizes a cost function by using a computer;

wherein the cost function includes an item that minimizes usage of the second-level routing matrix, the changing assignments includes finding a value of the cost function based on a route that connects a plurality of assigned processing elements that have been respectively assigned the plurality of functional blocks wherein the plurality of functional blocks include a plurality of types of functional block, and the provisionally assigning further includes assigning the plurality of functional blocks with priority given to a type of processing element with a low number of elements included in the plurality of processing elements out of the plurality of types of processing element, and when doing so, assigning a plurality of functional blocks that can be assigned to a plurality of processing elements of a first type randomly to processing elements out of the plurality of processing elements of the first type.

11. A program product for causing a computer to generate configuration data for configuring a reconfigurable device, wherein the device includes a plurality of processing elements and a routing matrix for connecting the plurality of processing elements and is reconfigured by changing functions of respective processing elements in the plurality of processing elements and/or changing at least some connections of the routing matrix, the plurality of processing elements are divided into a plurality of groups, processing elements included in each group are connected in a range of a first delay by a first-level routing matrix included in the routing matrix, and processing elements included in different groups are connected with a different delay to the first delay via a second-level routing matrix included in the routing matrix, and the program product comprises:

preparing hardware information on a computer accessible data base, the hardware information including definition data for the plurality of processing elements included in the respective groups and definition data for the routing matrix; and mapping a circuit design onto the plurality of processing elements for implementing the circuit design in the device by the configuration data, by having the computer carry out an iterative algorithm that minimizes a cost function, wherein the cost function includes an item that minimizes usage of the second-level routing matrix, the circuit design includes a data flow graph in which functions to be implemented in the device are expressed as a plurality of functional blocks that are capable of being implemented in processing elements out of the plurality of processing elements and connections between the plurality of functional blocks, and the plurality of processing elements include a plurality of types of processing element configurable respectively correspond to restricted types of functional block out of the plurality of types of functional block, and the mapping includes:

provisionally assigning the plurality of functional blocks to processing elements out of the plurality of processing elements divided into the plurality of groups; and changing assignments of the plurality of functional blocks to the plurality of processing elements using the iterative algorithm, the step of changing the assignments including finding a value of the cost function based on a route that connects a plurality of assigned processing elements that have been respectively assigned the plurality of functional blocks wherein the plurality of functional blocks include a plurality of types of functional block, and wherein the step of provisionally assigning further includes assigning the plurality of functional blocks with priority given to a type of processing element with a low number of elements included in the plurality of processing elements out of the plurality of types of processing element, and when doing so, assigning a plurality of functional blocks that can be assigned to a plurality of processing elements of a first type randomly to processing elements out of the plurality of processing elements of the first type.

12. The program according to claim 11,
wherein the mapping further includes:
analyzing the data flow graph and storing timing of inputs and/or outputs of data to and from the plurality of functional blocks in a memory of the computer; and
analyzing connections between the plurality of assigned processing elements including delays due to passing the second-level routing matrix, and assigning delays for realizing the timing stored in the memory to processing elements out of the plurality of processing elements.

13. A program product for causing a computer to map a circuit design onto a reconfigurable device,
wherein the device includes a plurality of processing elements and a routing matrix for connecting the plurality of processing elements and is reconfigured by changing functions of respective processing elements in the plurality of processing elements and/or changing at least some connections of the routing matrix,
the plurality of processing elements are divided into a plurality of groups, processing elements included in each group are connected in a range of a first delay by a first-level routing matrix included in the routing matrix, and processing elements included in different groups are connected with a different delay to the first delay via a second-level routing matrix included in the routing matrix,
the circuit design includes a data flow graph in which functions to be implemented in the device are expressed as a plurality of functional blocks that are capable of being implemented in processing elements out of the plurality of processing elements and connections between the plurality of functional blocks, and the plurality of processing elements include a plurality of types of processing element configurable respectively correspond to restricted types of functional block out of the plurality of types of functional block, and
the program product comprising:
provisionally assigning the plurality of functional blocks to processing elements out of the plurality of processing elements divided into the plurality of groups; and
changing assignments of the functional blocks to the plurality of processing elements using an iterative algorithm that minimizes a cost function,
wherein the cost function includes an item that minimizes usage of the second-level routing matrix, and the changing assignments includes finding a value of the cost function based on a route that connects a plurality of assigned processing elements that have been respectively assigned the plurality of functional blocks wherein the plurality of functional blocks include a plurality of types of functional block, and the provisionally assigning further includes assigning the plurality of functional blocks with priority given to a type of processing element with a low number of elements included in the plurality of processing elements out of the plurality of types of processing element, and when doing so, assigning a plurality of functional blocks that can be assigned to a plurality of processing elements of a first type randomly to processing elements out of the plurality of processing elements of the first type.

* * * * *